(12) United States Patent
Arai et al.

(10) Patent No.: US 7,250,365 B2
(45) Date of Patent: Jul. 31, 2007

(54) FABRICATION METHOD OF SEMICONDUCTOR INTEGRATED CIRCUIT DEVICE

(75) Inventors: Toshiyuki Arai, Machida (JP); Ryousei Kawai, Kodaira (JP); Hirofumi Tsuchiyama, Hitachinaka (JP); Fumiyuki Kanai, Nishitokyo (JP); Shinichi Nakabayashi, Hitachinaka (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/167,253

(22) Filed: Jun. 28, 2005

(65) Prior Publication Data

US 2005/0250331 A1 Nov. 10, 2005

Related U.S. Application Data

(63) Continuation of application No. 10/085,063, filed on Mar. 1, 2002, now Pat. No. 6,979,649.

(30) Foreign Application Priority Data

Apr. 17, 2001 (JP) .............................. 2001-118413

(51) Int. Cl.
 *H01L 21/4763* (2006.01)
(52) U.S. Cl. ............... 438/625; 438/692; 257/E21.237; 257/E21.304
(58) Field of Classification Search ........ 438/689–693, 438/618–627; 257/E21.237, E21.304
See application file for complete search history.

(56) References Cited

U.S. PATENT DOCUMENTS

| 5,868,857 A | 2/1999 | Moinpour et al. |
| 5,874,778 A | 2/1999 | Bhattacharyya et al. |
| 5,901,399 A | 5/1999 | Moinpour et al. |
| 5,976,267 A | 11/1999 | Culkins et al. |
| 6,059,889 A | 5/2000 | Jensen et al. |
| 6,150,696 A | 11/2000 | Iwamatsu et al. |
| 6,159,081 A | 12/2000 | Hakomori |
| 6,232,201 B1 | 5/2001 | Yoshida et al. |
| 6,261,953 B1 | 7/2001 | Uozumi |
| 6,267,649 B1 | 7/2001 | Lai et al. |
| 6,309,981 B1 | 10/2001 | Mayer et al. |
| 6,334,229 B1 | 1/2002 | Moinpour et al. |

(Continued)

FOREIGN PATENT DOCUMENTS

EP 1 167 583 A2 1/2002

(Continued)

OTHER PUBLICATIONS

Official Action from the Japanese Patent Office, for Japanese Patent Application No. 2001-118413, dated Jan. 30, 2007.

*Primary Examiner*—Brook Kebede
(74) *Attorney, Agent, or Firm*—Antonelli, Terry, Stout & Kraus, LLP.

(57) ABSTRACT

A method of fabrication of a semiconductor integrated circuit device, including polishing the entire area of an edge of a wafer, for example, uses three polishing drums in which a polishing drum polishes the upper surface of the edge of the wafer, a polishing drum polishes the central portion of the edge of the wafer and a polishing drum polishes the lower surface of the edge of the wafer, thereby preventing occurrence of obstacles which cause defoliation of thin films on the edge of the wafer.

6 Claims, 25 Drawing Sheets

U.S. PATENT DOCUMENTS

| | | |
|---|---|---|
| 6,361,708 B1 | 3/2002 | Kubo et al. |
| 6,376,363 B1 | 4/2002 | Iguchi |
| 6,482,749 B1 | 11/2002 | Billington et al. |
| 6,509,270 B1 | 1/2003 | Held |
| 6,683,007 B1 | 1/2004 | Yamasaki et al. |
| 6,924,236 B2 * | 8/2005 | Yano et al. ............ 438/692 |
| 2001/0024691 A1 | 9/2001 | Kimura et al. |
| 2001/0051432 A1* | 12/2001 | Yano et al. ............ 438/690 |
| 2002/0006876 A1 | 1/2002 | Hongo et al. |

FOREIGN PATENT DOCUMENTS

| | | |
|---|---|---|
| EP | 1 174 912 A1 | 1/2002 |
| JP | 64-71656 | 3/1989 |
| JP | 4-034931 | 2/1992 |
| JP | 5-41449 | 2/1993 |
| JP | 09-186234 | 7/1997 |
| JP | 10-296641 | 11/1998 |
| JP | 10-309666 | 11/1998 |
| JP | 10-328989 | 12/1998 |
| JP | 11-033888 | 2/1999 |
| JP | 11-045868 | 2/1999 |
| JP | 11-048109 | 2/1999 |
| JP | 11-090803 | 4/1999 |
| JP | 11-104942 | 4/1999 |
| JP | 2000-021882 | 1/2000 |
| JP | 2000-68273 | 3/2000 |
| JP | 2000-77414 | 3/2000 |
| JP | 2000-173885 | 6/2000 |
| JP | 2001-77113 | 3/2001 |

* cited by examiner

FABRICATION METHOD OF SEMICONDUCTOR INTEGRATED CIRCUIT DEVICE

This application is a Continuation application of prior application Ser. No. 10/085,063, filed Mar. 1, 2002 now U.S. Pat. No. 6,979,649, the contents of which are incorporated herein by reference in their entirety.

BACKGROUND OF THE INVENTION

This invention concerns a method of fabrication of a semiconductor integrated circuit device; and, more particularly, it relates to a technique that is applicable to the fabrication of a semiconductor integrated circuit device, including fabrication of semiconductor wafers.

The present inventors have conducted a search of the prior art with a view toward preventing the occurrence of obstacles extending from the edges of wafers. For example, Japanese Published Unexamined Patent Application No. 2000-68273 discloses a technique which involves polishing a metal film by a CMP method to form a pattern, and then removing any of the metal film which remains on edges of a device forming surface of the wafer by a wet etching method, laser or CMP method, thereby preventing the occurrence of obstacles extending from the edges.

Further, polishing apparatuses for polishing the edges of wafers are disclosed, for example, in Japanese Published Unexamined Patent Application Hei 11(1999)-104942, Japanese Published Unexamined Patent Application Hei 11(1999)-90803, Japanese Published Unexamined Patent Application Hei 11(1999)-48109, Japanese Published Unexamined Patent Application Hei 11(1999)-33888, Japanese Published Unexamined Patent Application Hei 10(1998)-328989, Japanese Published Unexamined Patent Application Hei 10(1998)-309666, Japanese Published Unexamined Patent Application Hei 10(1998)-296641, Japanese Published Unexamined Patent Application Hei 4(1992)-34931 and Japanese Published Unexamined Patent Application Sho 64(1989)-71656.

SUMMARY OF THE INVENTION

For decreasing the resistivity of wirings that constitute a semiconductor integrated circuit device, the application of a damascene method using copper series materials (copper or copper alloys) for wiring materials have been developed. The damascene method comprises the steps of forming grooves to accommodate wirings in an insulative film, then depositing a conductor film for forming the wirings on the insulation film and in the grooves for forming the wirings, further removing unnecessary portions of the conductor film, for example, by a chemical mechanical polishing method (CMP) thereby leaving the conductor film only in the grooves to form buried wirings in the grooves. This method can decrease the size of the wirings compared with the size of the wirings of usual structures and, more particularly, reduce the fabrication size for copper series materials for which fine fabrication by etching is difficult.

The present inventors have studied a method, in the step using CMP, of forming a pattern over the entire surface of a semiconductor wafer (hereinafter simply referred to as a wafer) which contains regions not capable of providing semiconductor chips (hereinafter simply referred to as a chip) as a product. This is because the uniformness of polishing produced by CMP tends to be influenced by the presence or absence of the pattern formed on the wafer. Further, for shortening the time required for exposure to transfer the pattern, the regions not capable of producing semiconductor chips as product are set to have such a small area that the uniformness of polishing by the CMP method can be maintained.

By the way, the yield of semiconductor integrated circuit devices, such as a DRAM (Dynamic Random Access Memory) is greatly effected by obstacles deposited on wafers used for the production. Particularly, obstacles are formed frequently at the edges of the wafers.

In a wafer, while the device-forming surface capable of producing semiconductor chips as a product is flat, the edges thereof are in a rounded state having an angle relative to the flat surface. The present inventors have found that thin films are defoliated at the rounded portions so as to form a source for obstacles. The mechanism for defoliation of the thin film will be explained, for example, with reference to a case involving a STI (Shallow Trench Isolation) step.

At first, after forming a pad oxide film on the surface of a wafer, a silicon nitride film is deposited on the pad oxide film. Successively, after patterning the silicon nitride film by dry etching using a photoresist film, the pad oxide film and the wafer are etched using the photoresist film and the remaining silicon nitride film as a mask to form grooves in the wafer. Then, after forming a thin oxide film to the inside of the grooves, a silicon oxide film is deposited over the wafer. Successively, after densifying the silicon oxide film, the silicon oxide film is polished by the CMP method with the silicon nitride film serving as a polishing end point indicator, so as to leave the silicon oxide film inside of the grooves.

By the way, as described above, while the device forming surface in the wafer capable of obtaining the semiconductor chips is flat, the edges thereof are in a rounded state having an angle relative to the flat surface. Therefore, portions above the patterned pad oxide film and silicon nitride film at the edges are in a state where they are covered with the silicon oxide film. While the pad oxide film and the silicon nitride film are removed after the step described above, the pad oxide film and the silicon nitride film at the wafer edges are covered with the silicon oxide film, so that they are left and not removed.

Subsequently, after forming a well by implanting impurities into the wafer, the silicon oxide film covering the pad oxide film and the silicon nitride film of the wafer edges are removed by a cleaning step, using an HF (hydrofluoric acid) cleaning solution, to expose the pad oxide film and the silicon nitride film. In this case, the pad oxide film is etched and the silicon nitride film thereabove is defoliated so as to form obstacles. Further, in the succeeding steps, since steps such as HF cleaning are repeated, the pad oxide film is etched in each of the steps and the silicon nitride film thereabove is defoliated to possibly form obstacles.

This invention intends to provide a technique for preventing occurrence of obstacles extending from a wafer in the fabrication of a semiconductor integrated circuit device.

These and other objects, as well as novel features of this invention, will become apparent from the descriptions of the present invention in this specification, in conjunction with the appended drawings.

Among the various aspects and features of the inventions disclosed in the present application, an outline of typical ones will be explained briefly.

That is, this invention includes the steps of forming a first insulative film on the surface of a semiconductor wafer, removing the first insulative film on the edge of the semiconductor wafer, patterning the first insulative film after the step of removing the first insulative film, and forming a second insulative film over the semiconductor wafer including a portion above the first insulative film after patterning the first insulative film.

Further, this invention includes the steps of forming a first insulative film on the surface of a semiconductor wafer, a step of patterning the first insulative film, forming a second insulative film over the semiconductor wafer including a portion above the first insulative film after patterning the first insulative film, mechanically and chemically polishing the surface of the second insulative film, thereby flattening the surface thereof, and polishing the second insulative film on the edges of the semiconductor wafer with the first insulative film serving as a polishing end point indicator.

Further, this invention includes the steps of forming a third insulative film on the surface of a semiconductor wafer, a step of patterning the third insulative film, forming a first conductive film above the semiconductor wafer after patterning the third insulative film, removing the first conductive film on the edges of the semiconductor wafer after forming the first conductive layer and polishing the first conductive film, with the surface of the third insulative film above a region for obtaining semiconductor chips of the semiconductor wafer serving as a polishing end point indicator.

Further, this invention includes steps of forming a third insulative film above the surface of a semiconductor wafer, a step of patterning the third insulative film, forming a first conductive film on the semiconductor wafer after patterning the third insulative film, polishing the first conductive film with the surface of the third insulative film at a portion above a semiconductor chip obtaining region serving as a polishing end point indicator, and removing the first conductive film on the edges of the semiconductor wafer after polishing the first conductive film.

DETAILED DESCRIPTION OF PREFERRED EMBODIMENTS

Figure 1:
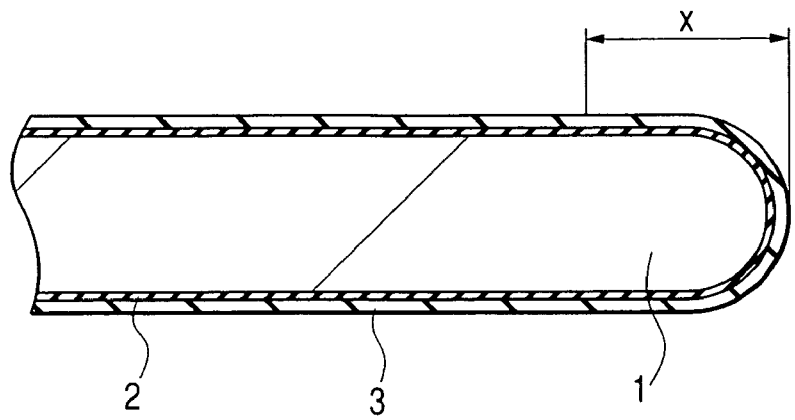
FIG. 1 is a fragmentary cross sectional view showing an example of a method of fabrication of a semiconductor integrated circuit device as a preferred embodiment according to this invention.

The meanings of terms used in the present specification will be explained before describing the invention specifically.

The term "wafer" refers to a single crystal silicon substrate (generally, of a substantially planar disk-like shape), a sapphire substrate, a glass substrate and other insulative, semi-insulative or semiconductive substrates, as well as composite substrates thereof. Further, the term "semiconductor integrated circuit devices" when referred to in the present specification includes not only those devices prepared on a semiconductive or insulative substrate, such as a silicon wafer and a sapphire substrate, but also those devices prepared on an insulative substrate, such as a substrate made of glass, for example, in TFT (Thin-Film-Transistor) and STN (Super-Twisted-Nematic) liquid crystals unless otherwise specified.

A device forming surface is a main surface of a wafer on which a disk pattern corresponding to plural chip regions is formed by photolithography.

An edge of a wafer is a region at the outer periphery of the wafer having an angle relative to the planar main surface and the rear face of the wafer, also including regions from the outer end in the planar main surface and rear face of the wafer to regions capable of providing chips as a product.

A transfer pattern is a pattern transferred by a mask on the wafer, and, more specifically, it is a resist pattern and a pattern on the wafer formed actually by using a resist pattern as a mask.

The resist pattern is a film pattern formed by patterning a light sensitive resin film (resist film) by photolithography. The pattern also includes a mere resist film with no openings at all in the relevant portion.

Mechanical and chemical polishing generally refers to the polishing of a surface to be polished, while bringing the surface into contact with a polishing pad made, for example, of a relatively soft cloth-like sheet material and while moving the surface relatively in both directions under supply of a slurry. In this specification, it also includes a method of polishing by moving a surface to be polished relative to the surface of a hard grinding wheel, as well as a method of using fixed abrasive grains and an abrasive grain free CMP process not using abrasive grains.

The preferred embodiments, to be described below, are divided into plural sections or embodiments when necessary for the sake of convenience of description. However, unless otherwise specified, they are not irrelevant with each other, but are in such a relation that one of them is a partial or entire modified example, detail or supplementary explanation for the others.

Further, when numbers of constituents (also including numbers of components, numerical values, amounts and ranges) are referred to, the invention is not restricted to such specified numbers, but may involve more than or less than the specified numbers, unless otherwise specified or except for the case where they are apparently restricted to the specified numbers in view of principle.

Further, in the following embodiments, the constituent elements (also including elemental steps) are not always essential unless otherwise specified, or except for the case where they are considered apparently essential.

In the same manner, when the shape and the positional relationship or the like of the constituent elements are referred to in the following embodiments, they include also those substantially similar in shape and positional relationship unless otherwise specified, or except for the case where they are considered apparently not so in view of principle. This is also applicable to the numeral values and the ranges described above.

In the drawings used for the pretreated embodiments, a transfer pattern formed in a region not capable of obtaining chips as a product in the wafer is hatched also in the plan view for the sake of making the drawing easy to see.

Further, in the preferred embodiments, MISFET (Metal Insulator Semiconductor Field Effect Transistor) typically representing field effect transistors is simply referred to as MIS, a p-channel type MISFET as pMIS, and an n-channel type MISFET as nMIS.

Preferred embodiments of this invention will be explained in detail with reference to the drawings. Throughout the drawings which illustrate the preferred embodiments, those components having identical functions carry the same reference numerals, for which duplicate descriptions are omitted.

Embodiment 1

In Embodiment 1, this embodiment of the invention is applied, for example, to a method of fabrication of a semiconductor integrated circuit device in which an nMISQn is formed in a p-well in a semiconductor substrate.

Figure 2:
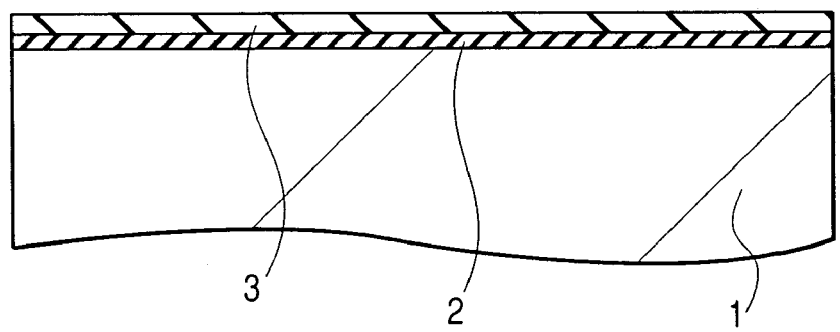
FIG. 2 is a fragmentary cross sectional view showing, on an enlarged scale, the vicinity of a device-forming surface of the wafer shown in FIG. 1.

FIG. 1 and FIG. 2 are fragmentary cross sectional views of a wafer (semiconductor substrate) 1 of Embodiment 1. FIG. 1 shows, particularly, the vicinity of an edge of the wafer 1, and FIG. 2 shows, particularly, the vicinity of a device forming surface in the wafer 1 on an enlarged scale.

At first, as shown in FIG. 1 and FIG. 2, a wafer comprising a single crystal silicon (semiconductor substrate) 1 having a specific resistivity of about 10 Ωcm is provided. FIG. 2 is a fragmentary cross sectional view showing, on an enlarged scale, the vicinity of a device surface of the wafer 1. In Embodiment 1, the wafer has a thickness of about 750 µm and an outer periphery in a rounded state of about 350 µm radius. Further, in Embodiment 1, the edge width X of the wafer 1 is about 5 mm from the outer peripheral end of the wafer 1.

Successively, the wafer 1 is heat-treated at about 850° C., and a thin silicon oxide film (pad oxide film) 2 of about 10 nm thickness (first insulative film) is formed on the surface, and then a silicon nitride film 3 (first insulative film) of about 120 nm thickness is deposited on the silicon oxide film by a CVD (Chemical Vapor Deposition) method. The silicon oxide film 2 is formed for the purpose of relaxing stresses applied to the substrate, for example, upon densifying a shrink-fitting silicon nitride film buried in the device isolation grooves in the succeeding step. Further, since the silicon nitride film 3 is less oxidized, it is utilized as a mask for preventing oxidation on the surface of the wafer 1 therebelow (active region).

Figure 3:
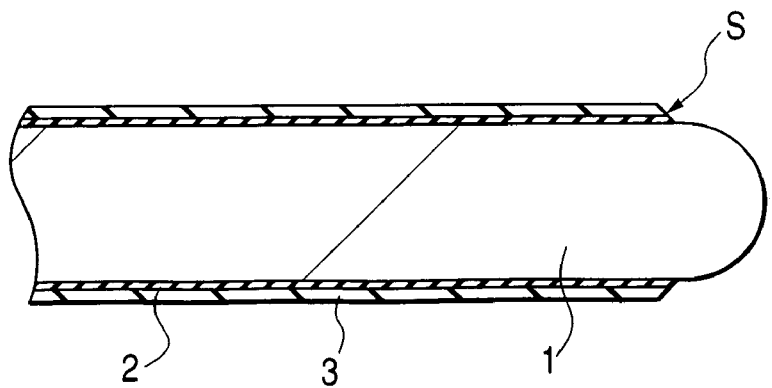
FIG. 3 is a fragmentary cross sectional view showing the state during a step in the fabrication of the semiconductor integrated circuit device succeeding the step shown in FIG. 1.

Then, as shown in FIG. 3, the silicon oxide film 2 and the silicon nitride film 3 on the edge of the wafer 1 are removed. This can prevent the silicon oxide film and the silicon nitride film 3 from remaining on the edge of the wafer. That is, it can prevent defoliation of the silicon oxide film 2 and the silicon nitride film 3 in the succeeding cleaning step, which materials are likely to be deposited again on the wafer 1 to thereby reduce the yield of the semiconductor integrated circuit device. Further, the step of removing the silicon oxide film 2 and the silicon nitride film 3 on the edge of the wafer 1 is adapted such that the end face S for the silicon oxide film 2 and the silicon nitride film 3 has an angle of about 5° C. to 75° C. relative to the device forming surface of the wafer 1 after the removing step. Thus, in the subsequent thin film deposition step that the coverage of the thin film from the surface S to the surface of the wafer 1 is prevented.

Figure 4:
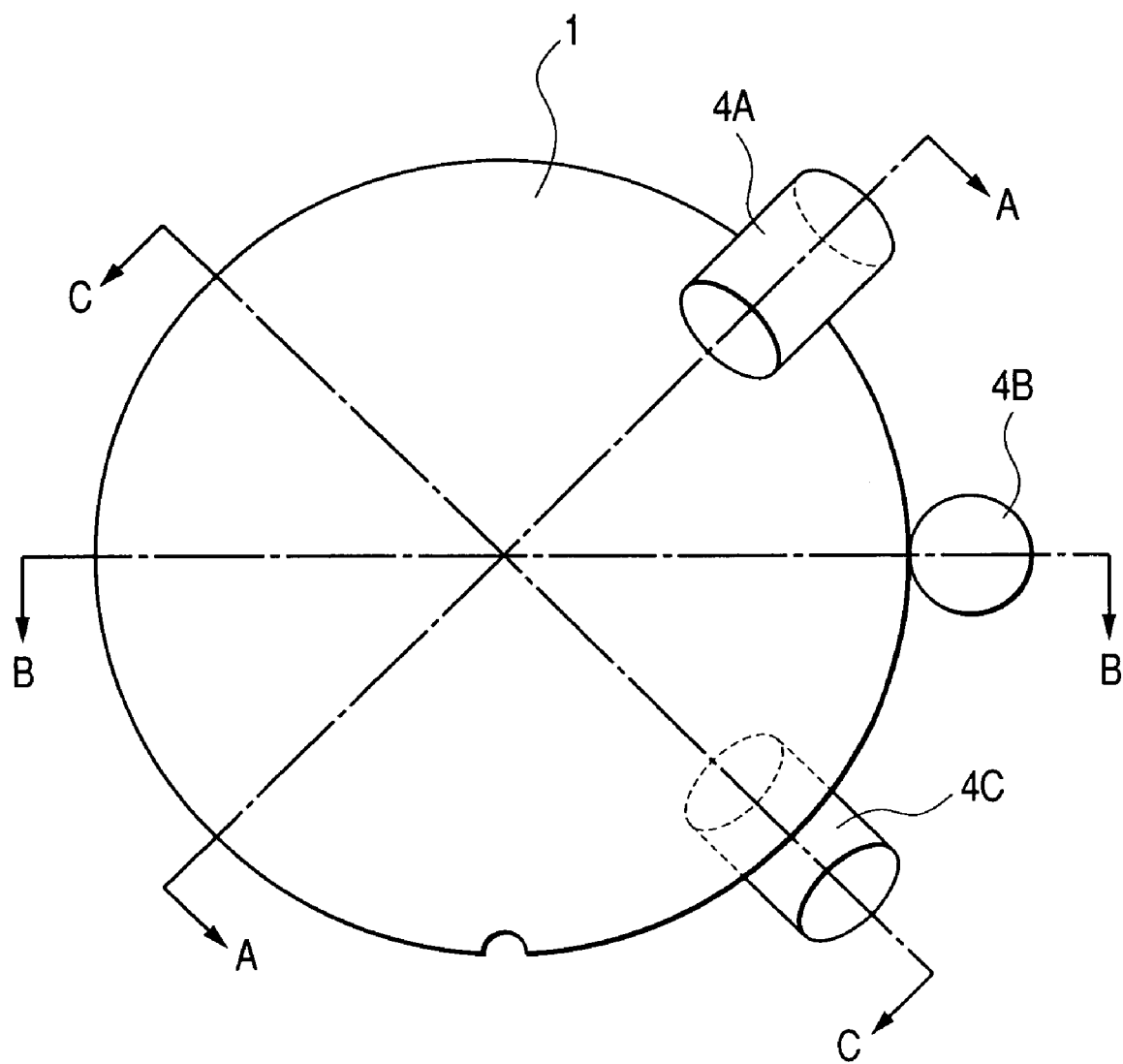
FIG. 4 is a plan view illustrating the polishing of edges of a wafer using polishing drums.

The step of removing the silicon oxide film 2 and the silicon nitride film 3 is conducted by using plural polishing drums, and, for example, an embodiment using three polishing drums 4A to 4C (polishing device) is shown in FIG. 4. Use of the plural polishing drums facilitates polishing of the entire area of the edge of the wafer 1, and, in this way, the time required for polishing can be shortened. Each of the polishing drums 4A to 4C has a soft polishing pad wound around at the periphery thereof, and polishing is conducted by supplying a slurry, such as a colloidal silica, cerium oxide or aluminum oxide, to the polishing surface.

Figure 5:
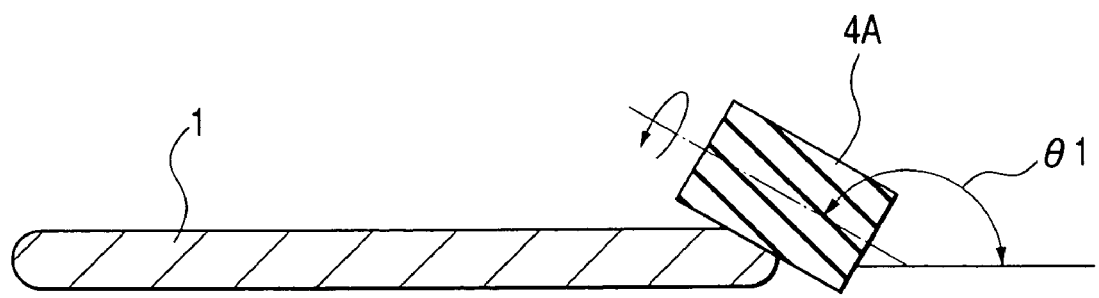
FIG. 5 is a fragmentary cross sectional view illustrating the angle of contact between one of the polishing drums shown in FIG. 4 and the edge of the wafer.
Figure 6:
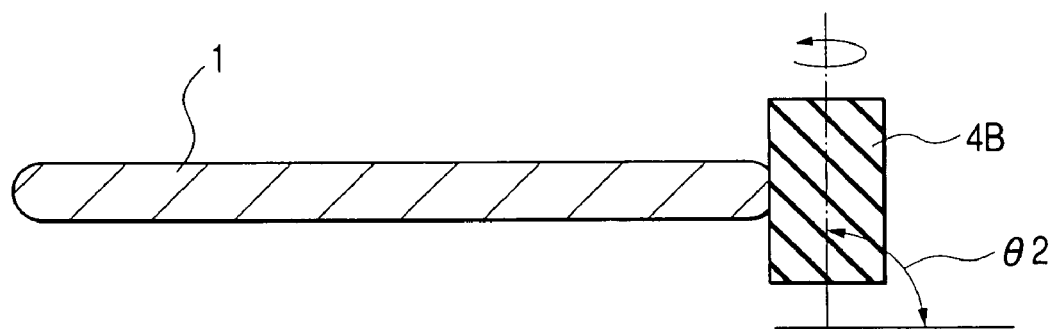
FIG. 6 is a fragmentary cross sectional view illustrating the angle of contact between one of the polishing drums shown in FIG. 4 and the edge of the wafer.
Figure 7:
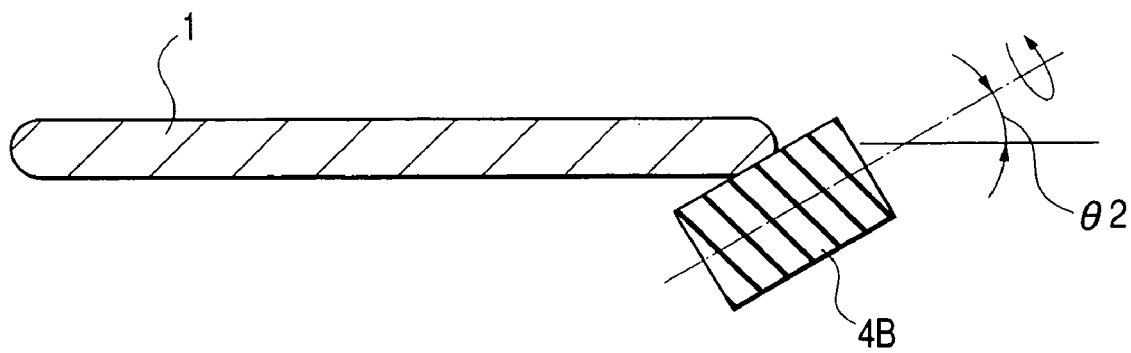
FIG. 7 is a fragmentary cross sectional view illustrating the angle of contact between one of the polishing drums shown in FIG. 4 and the edge of the wafer.

FIG. 5 to FIG. 7 are, respectively, cross sectional views taken along line A-A (refer to FIG. 4), line B-B (refer to FIG. 4) and line C-C (refer to FIG. 4).

As shown in FIG. 5 to FIG. 7, the polishing drum 4A polishes the upper surface of the edge of the wafer 1 (device forming surface), the polishing drum 4B polishes a central portion of the edge of the wafer 1, and the polishing drum 4C polishes the lower surface (rear face) of the edge of the wafer. Further, the polishing drums 4A to 4C conduct polishing by rotation while contacting the wafer 1 at angles of $\theta_1$ to $\theta_3$ that are different from each other. Accordingly, it is possible to remove the silicon oxide film 2 and the silicon nitride film 3 over the entire area of the edge of the wafer 1.

Figure 8:
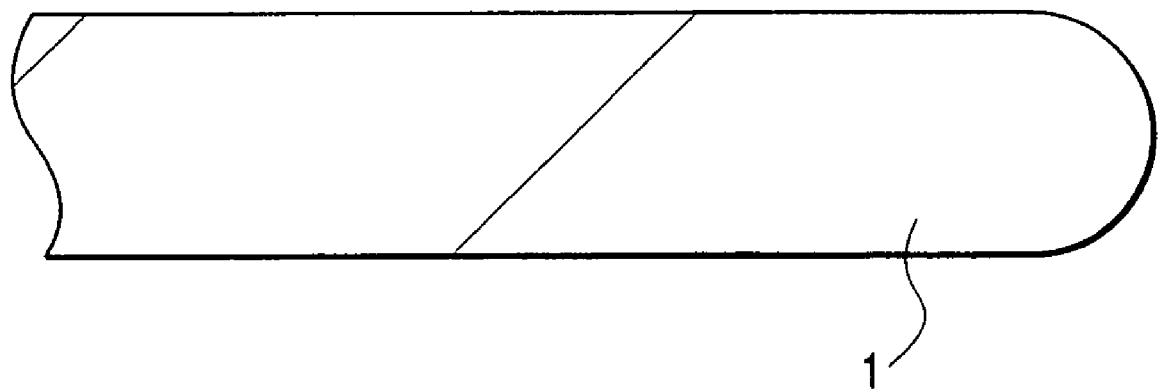
FIG. 8 is a fragmentary cross sectional view illustrating the difference in the shape of an edge of a wafer.
Figure 9:
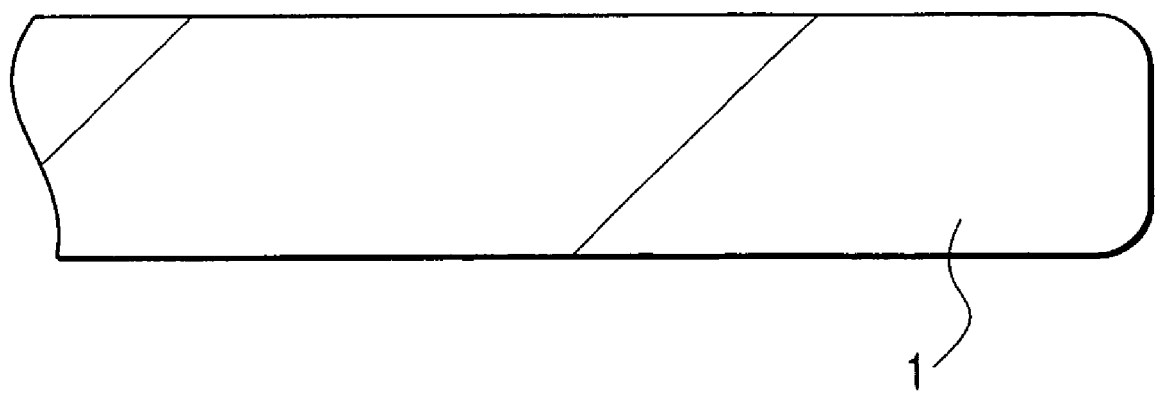
FIG. 9 is a fragmentary cross sectional view illustrating the difference in the shape of an edge of a wafer.

The shape of the edge of the wafer 1 includes a shape in which the edge is in the form of an arc, a so-called fully round type as shown in FIG. 8, or a shape in which the end of the edge is flat, a so-called top end flat type as shown in FIG. 9. In Embodiment 1, angles $\theta_1$ to $\theta_3$ at which the polishing drums 4A to 4C are in contact with the wafer 1, respectively, can be set properly in accordance with the desired shape of the edge of the wafer 1. Further, the angles $\theta_1$ to $\theta_3$ can be set properly in accordance with the deposition state of the silicon oxide film 2 and the silicon nitride film 3 to be removed. That is, by using the polishing drums 4A to 4C in Embodiment 1, the silicon oxide film 2 and the silicon nitride film 3 can be removed with respect to the various shapes of the edges of the wafer 1, as shown in FIG. 8 and FIG. 9, over the entire region of the edge.

Further, for the polishing drums 4A to 4C, the number of rotations and the pressure in contact with the wafer 1 can be set properly to change the polishing speed. That is, the optimal polishing speed of the polishing drums 4A to 4C can be set in accordance with the shape of the edge of the wafer 1 as described above in accordance with the standard of the wafer 1 and the film deposition state of the silicon oxide film 2 and the silicon nitride film 3.

Figure 10:
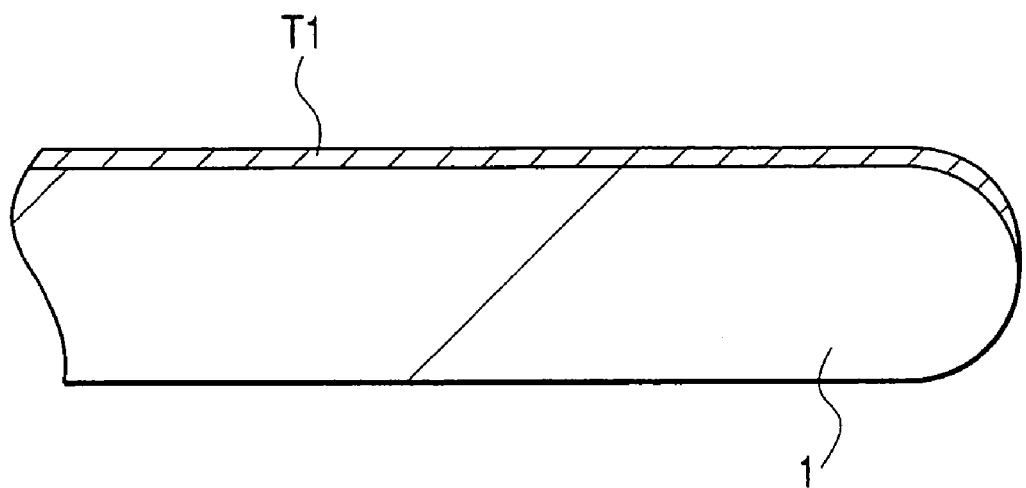
FIG. 10 is a fragmentary cross sectional view illustrating the difference in a film deposition state of a thin film deposited on a wafer.

Further, also in a case of removing other thin films deposited on the edge of the wafer by using the polishing drums 4A to 4C in the subsequent steps, the thin films can be removed for the entire edge area of the wafer 1 by optionally setting the angles $\theta_1$ to $\theta_3$ and the optimal polishing speed of the polishing drums 4A to 4C. In a case where a thin film T1 is formed only on the upper side (device forming surface) of the wafer 1 relatively, as shown in FIG. 10, the angle can be set, for example, as: $\theta_1=150°$, $\theta_2=120°$, $\theta_3=60°$. In this case, when the thin film is able to be removed using only the polishing drums 4A and 4B, the polishing drum 4C can be eliminated.

Figure 11:
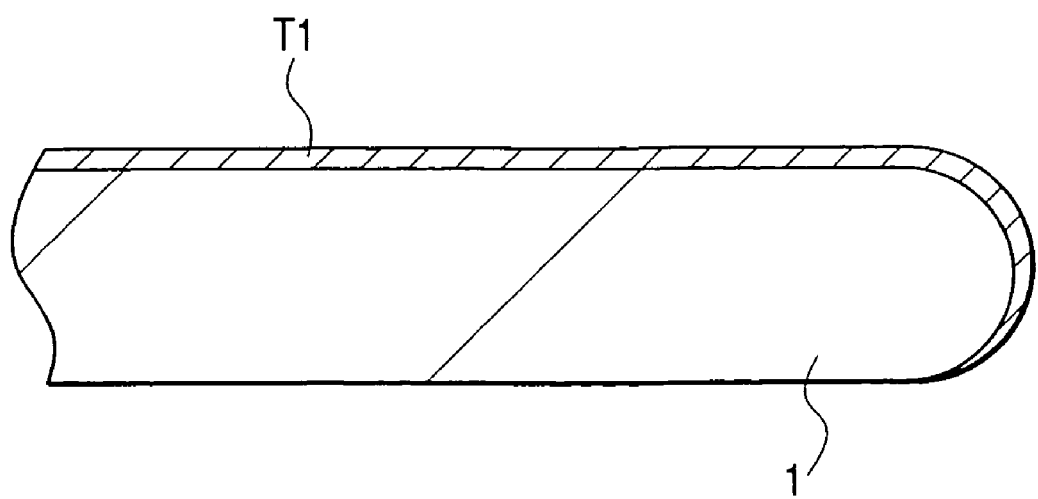
FIG. 11 is a fragmentary cross sectional view illustrating the difference in a film deposition state of a thin film deposited on a wafer.

On the other hand, in a case where the thin film T1 is formed from the upper surface (device forming surface) to the vicinity of the lower surface (rear face) of the wafer 1, as shown in FIG. 11, or in a case where the film is formed over the entire surface of the wafer 1, the angle can be set, for example, as $\theta_1=135°$, $\theta_2=90°$, $\theta_3=45°$. The thin film T1 on the edge of the wafer 1 can be removed in a short time by setting the angles $\theta_1$-$\theta_3$ as described above.

In Embodiment 1, while a method of removing the silicon oxide film 2 and the silicon nitride film 3 on the edge of the wafer 1 by using the polishing drums 4A to 4C has been described, the silicon oxide film 2 and the silicon nitride film 3 may be removed also by a dry etching method or a wet etching method, instead of with the use of the polishing drums 4A to 4C.

Figure 12:
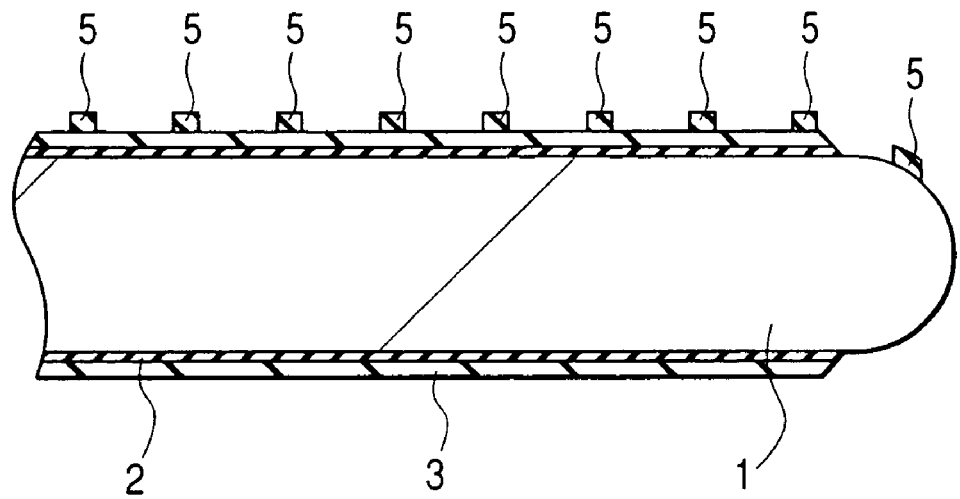
FIG. 12 is a fragmentary cross sectional view during a step in the fabrication of a semiconductor integrated circuit device succeeding the step shown in FIG. 3.
Figure 13:
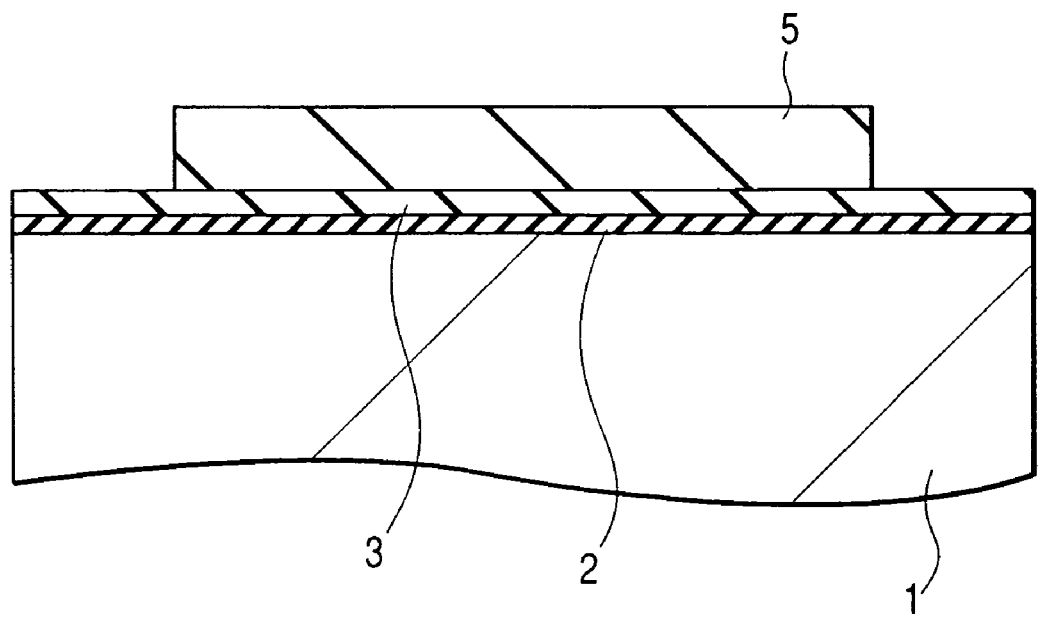
FIG. 13 is a fragmentary cross sectional view showing, on an enlarged scale, the vicinity of a device-forming surface of the wafer shown in FIG. 12.
Figure 14:
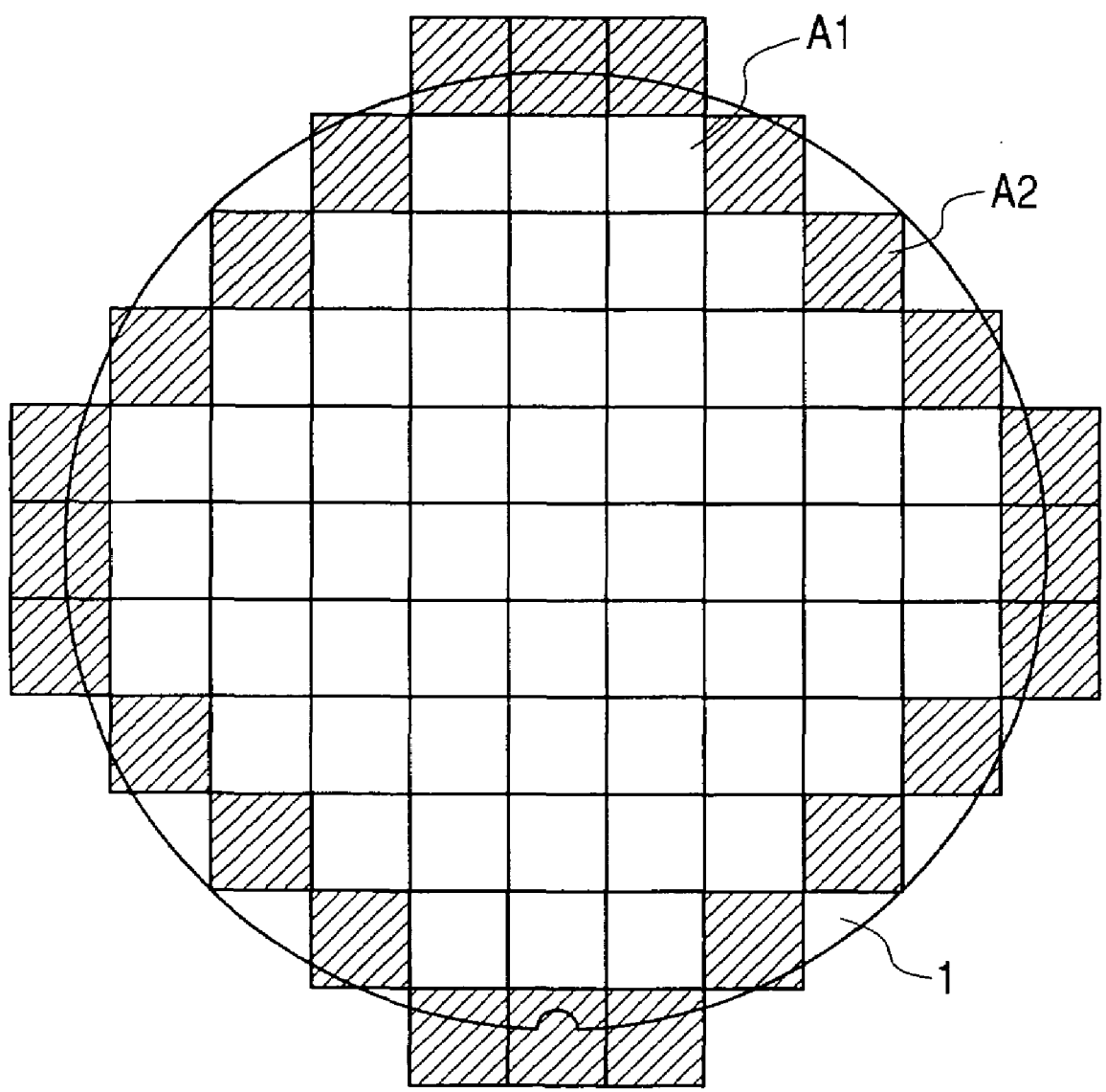
FIG. 14 is a plan view of a chip region capable of providing chips and a dummy exposure region at the periphery thereof.

Then, as shown in FIG. 12 and FIG. 13, after coating a photoresist film 5 on the wafer 1, the photoresist film 5 is patterned by exposure using a mask. In this case, as shown in FIG. 14, the photoresist film 5 is patterned also in a dummy exposure region (hatched area) A2 at the periphery of a chip region A1 that is capable of producing chips. This is done for improving the uniformity of polishing in the subsequent polishing step by the CMP method.

Figure 15:
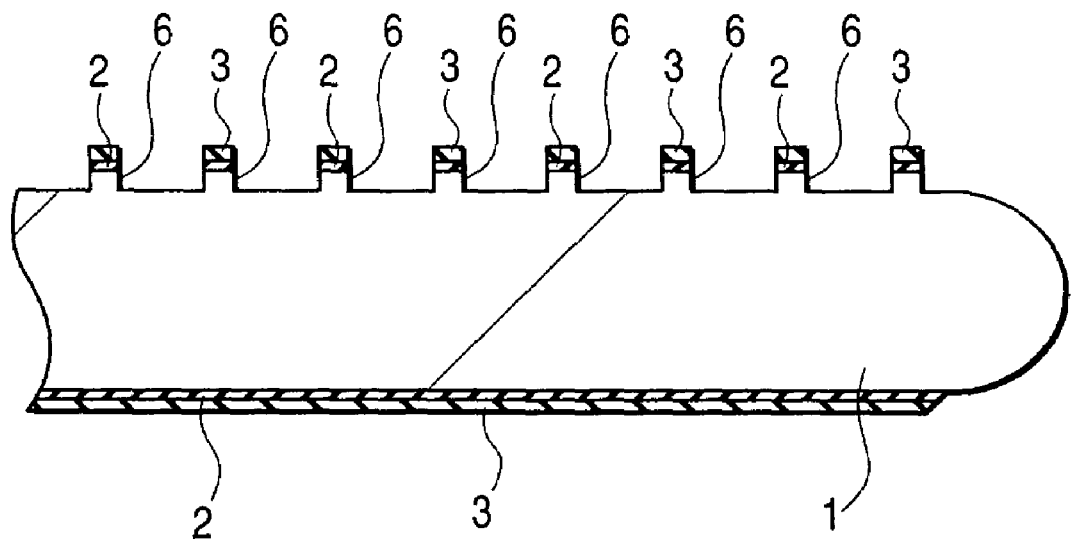
FIG. 15 is a fragmentary cross sectional view showing a step in the fabrication of a semiconductor integrated circuit device succeeding the step shown in FIG. 12.
Figure 16:
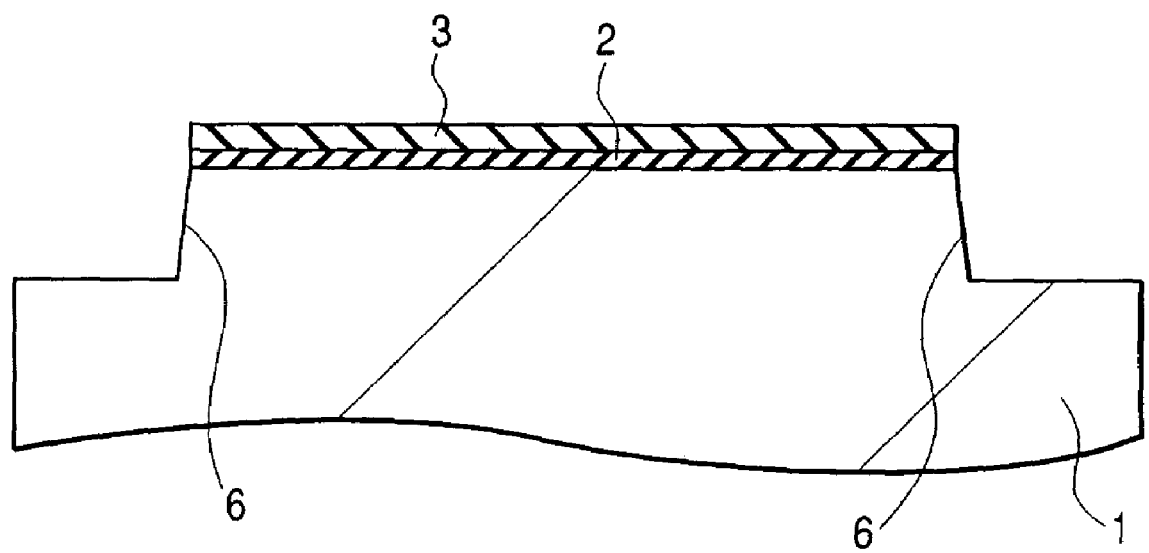
FIG. 16 is a fragmentary cross sectional view showing, on an enlarged scale, the vicinity of a device-forming surface of the wafer shown in FIG. 13.

Then, as shown in FIG. 15 and FIG. 16, the silicon nitride film 3 and the silicon oxide film 2 in the device isolation region are removed by dry etching using the photoresist film 5 as a mask. Successively, grooves 6, each of about 350 nm depth, are formed on the wafer at the device isolation region by dry etching using the silicon nitride film 3 as a mask.

Figure 17:
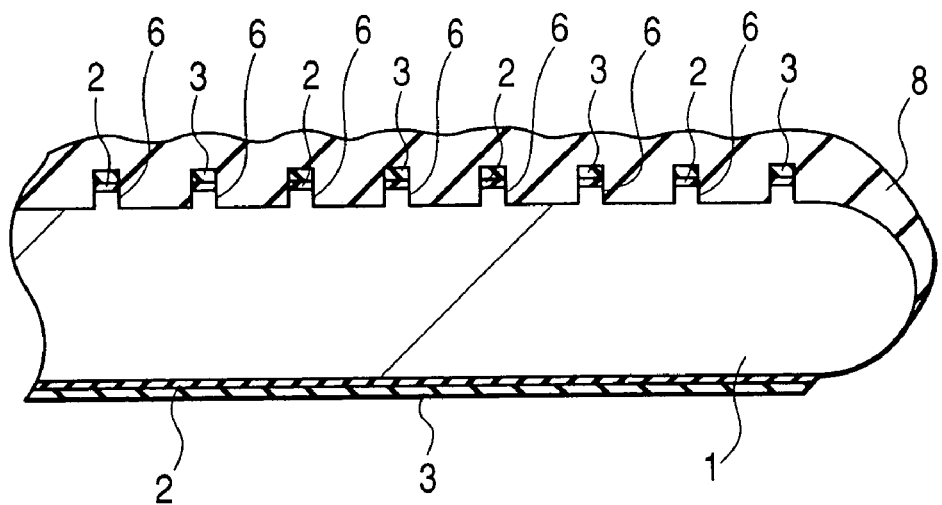
FIG. 17 is a fragmentary cross sectional view showing a step in the fabrication of a semiconductor integrated circuit device succeeding the step shown in FIG. 15.
Figure 18:
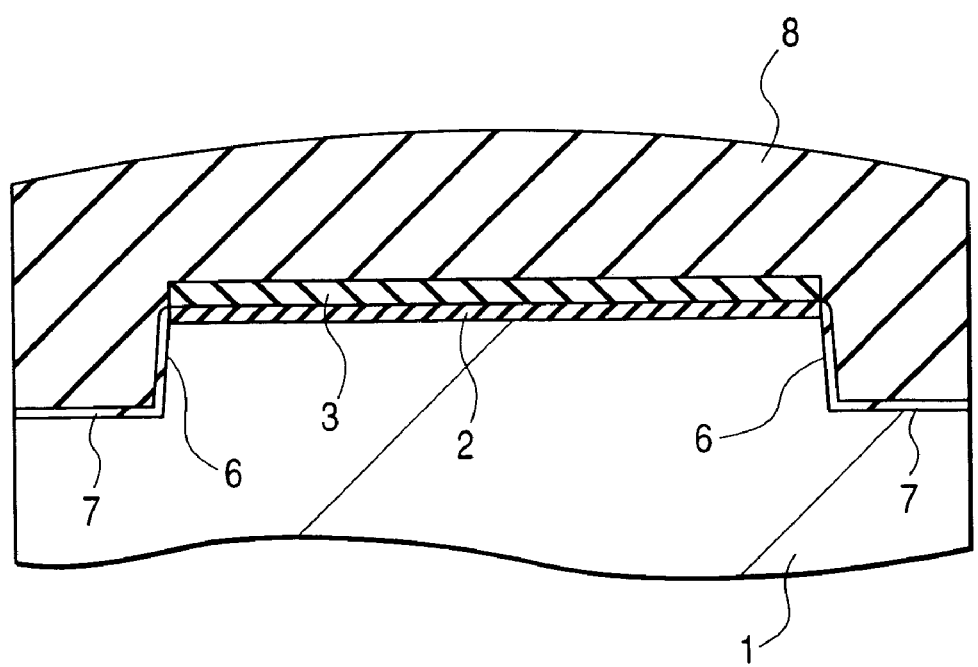
FIG. 18 is a fragmentary cross sectional view showing, on an enlarged scale, the vicinity of a device forming surface of the wafer shown in FIG. 17.

Then, as shown in FIG. 17 and FIG. 18, for removing damaged layers formed on the inner wall of the grooves 6 by etching, the wafer 1 is heat treated at about 1000© to form a silicon oxide film 7 of about 10 nm thickness on the inner wall of the grooves 6. Successively, a silicon oxide film 8 (second insulative film) of about 380 nm thickness is deposited on the wafer 1 by a CVD method, and then the wafer 1 is heat treated to densify (sinter) the silicon oxide film 8 in order to improve the film quality of the silicon oxide film 8.

Figure 19:
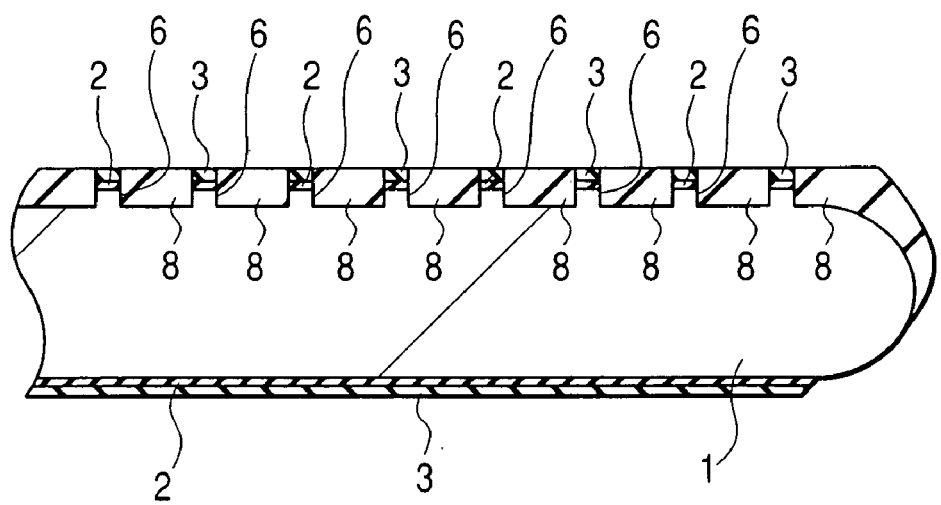
FIG. 19 is a fragmentary cross sectional view showing a step in the fabrication of a semiconductor integrated circuit device succeeding the step shown in FIG. 17.
Figure 20:
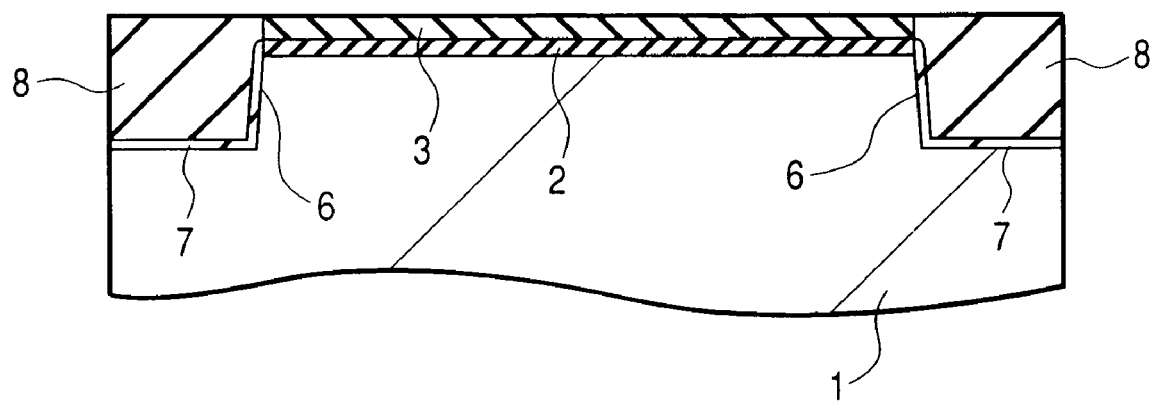
FIG. 20 is a fragmentary cross sectional view showing, on an enlarged scale, the vicinity of a device-forming surface of the wafer shown in FIG. 19.
Figure 21:
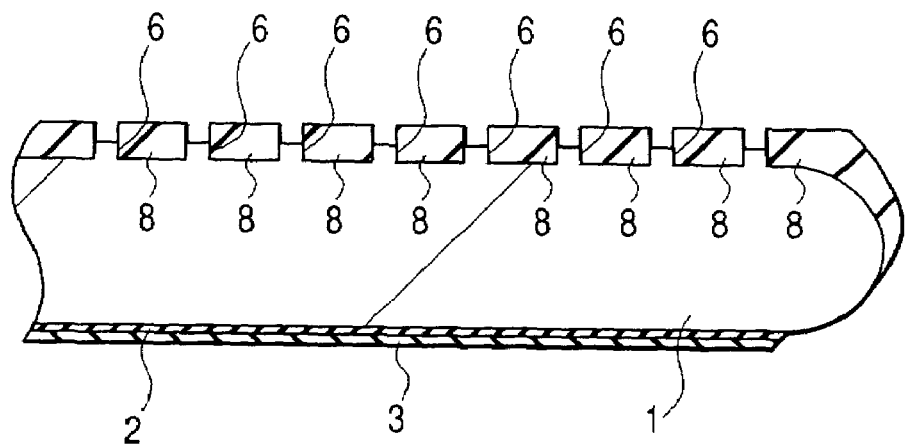
FIG. 21 is a fragmentary cross sectional view during a step in the fabrication of a semiconductor integrated circuit device succeeding the step shown in FIG. 19.
Figure 22:
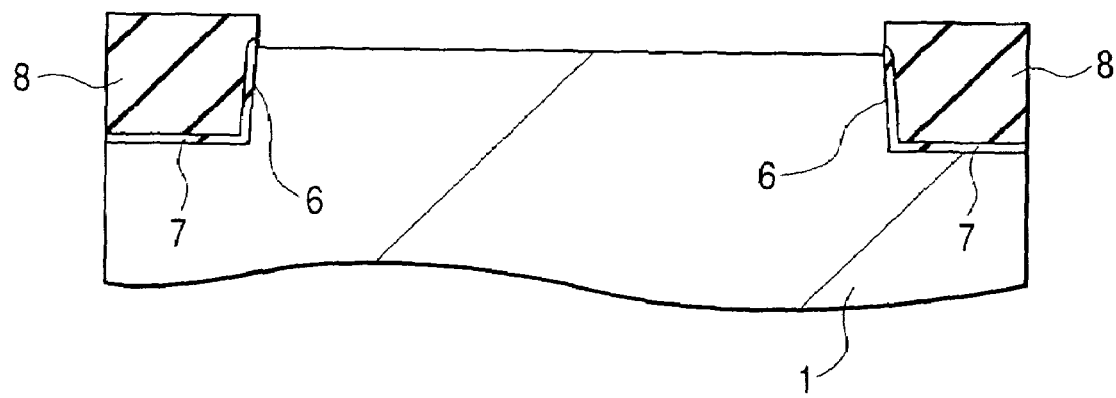
FIG. 22 is a fragmentary cross sectional view showing, on an enlarged scale, the vicinity of a device-forming surface of the wafer shown in FIG. 21.

Then, as shown in FIG. 19 and FIG. 20, the silicon oxide film 8 is polished by a CMP method using the silicon nitride film 3 as a stopper to leave the film in the inside of the grooves 6, thereby forming device isolation grooves planarized at the surface. Then, as shown in FIG. 21 and FIG. 22, the silicon nitride film 3 and the silicon oxide film 2 remaining on the active region of the wafer 1 are removed by wet etching using hot phosphoric acid. Since the silicon nitride film 3 and the silicon oxide film 2 on the edge of the wafer 1 were already removed, the silicon nitride film 3 and the silicon oxide film 2 covered with the silicon oxide film 8 are not present on the edge. That is, in the subsequent cleaning step, it is possible to prevent the silicon nitride film 3 and the silicon oxide film 2 from being defoliated so as to form obstacles.

Figure 23:
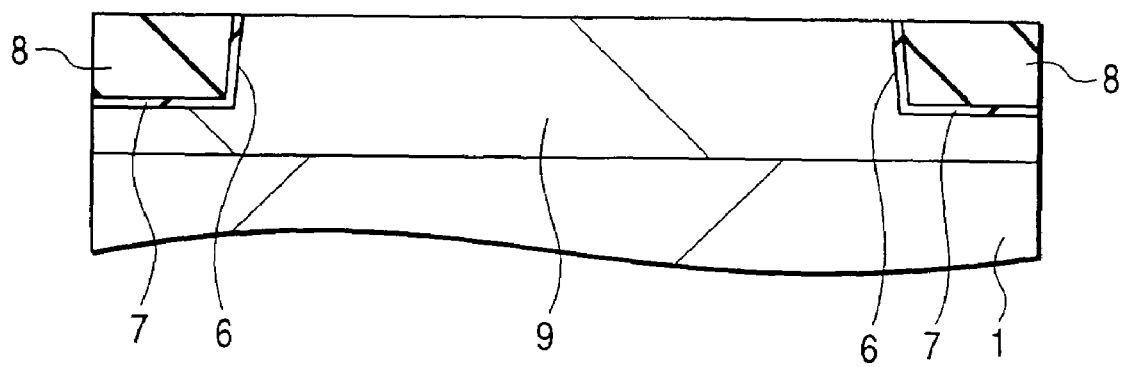
FIG. 23 is a fragmentary cross sectional view showing a step in the fabrication of a semiconductor integrated circuit device succeeding the step shown in FIG. 22.

Then, as shown in FIG. 23, the wafer 1 is subjected to a heat treatment to form a thin silicon oxide film (not illustrated) as a pad oxide film upon ion implantation to the main surface of the wafer 1. Successively, n-impurities, for example, B (boron), are ion implanted into a region forming nMIS of the wafer 1 to form a p-well 9. After forming the p-well 9, the silicon oxide film used for the ion implantation step is removed by using an HF (fluoric acid) type cleaning solution. In this case, since the surface of the silicon oxide film 8 is also wet etched, the surface height of the silicon oxide film 8 and the surface height of the wafer 1 in a region formed with the p-well 9 are substantially identical.

Figure 24:
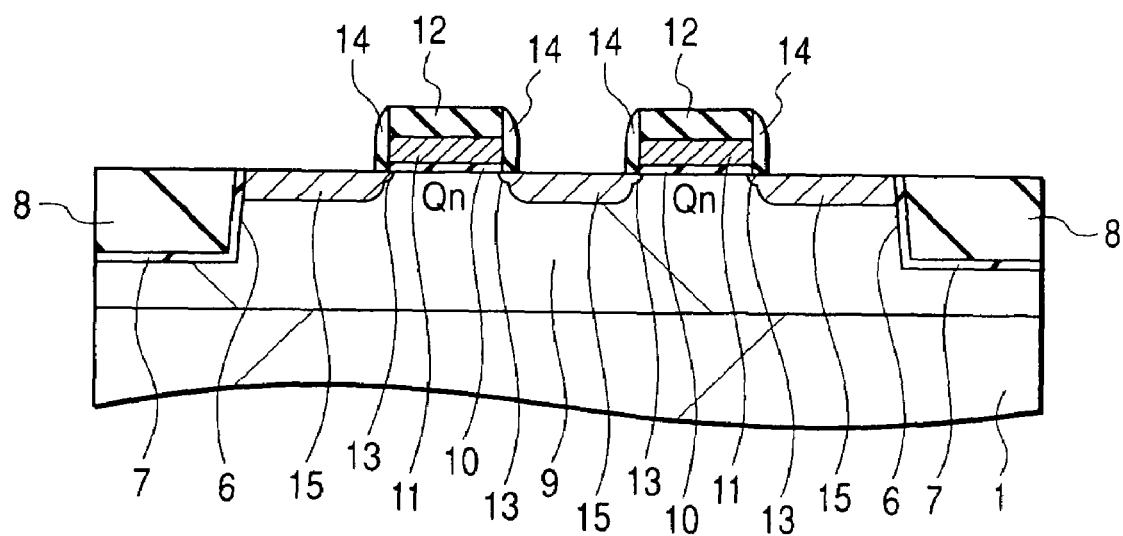
FIG. 24 is a fragmentary cross sectional view showing a step in the fabrication of a semiconductor integrated circuit device succeeding the step shown in FIG. 23.

Then, as shown in FIG. 24, the wafer 1 is wet oxidized to form a clean gate oxide film 10 of about 3.5 nm thickness to the surface of the p-well 9. Successively, a non-doped polycrystal silicon film of about 90 to 100 nm thickness is deposited by a CVD method above the wafer 1. Successively, P (phosphorus), for example, is ion implanted into the non-doped polycrystal silicon film in the upper portion of the p-well 9 to form an n-polycrystal silicon film. Further, a silicon oxide film is deposited on the surface of the n-polycrystal silicon film, thereby forming a stacked film, and the stacked film is etched by using a photoresist film patterned by lithography as a mask, thereby to form a gate electrode 11 and a cap insulative film 12. A high melting metal silicide film such as $WSi_x$, $MOSi_x$, $TiSi_x$, $TaSi_x$ or $CoSi_x$, may be stacked over the gate electrode 11. The cap insulative film 12 can be formed, for example, by a CVD method.

Successively, after removing the photoresist film used for the fabrication of the gate electrode 11, n-type impurities, for example, P (phosphorus), are ion implanted to the p-well 9 to form an $n^-$-type semiconductor regions 13 on both sides of the gate electrode 11.

Successively, a silicon oxide film of about 100 nm thickness is deposited over the wafer 1 by a CVD method, and the silicon oxide film is etched anisotropically by using reactive ion etching (RIE) to form side wall spacers 14 on both sides of the gate electrode 11 of the nMIS. Successively, n-impurities, for example, As (arsenic) are ion implanted to p-well 9 to form an $n^+$-type semiconductor region 15 (source•drain) of the nMIS. Thus, a source and drain region of an LDD (Lightly Doped Drain) structure is formed to complete the nMISQn.

Figure 25:
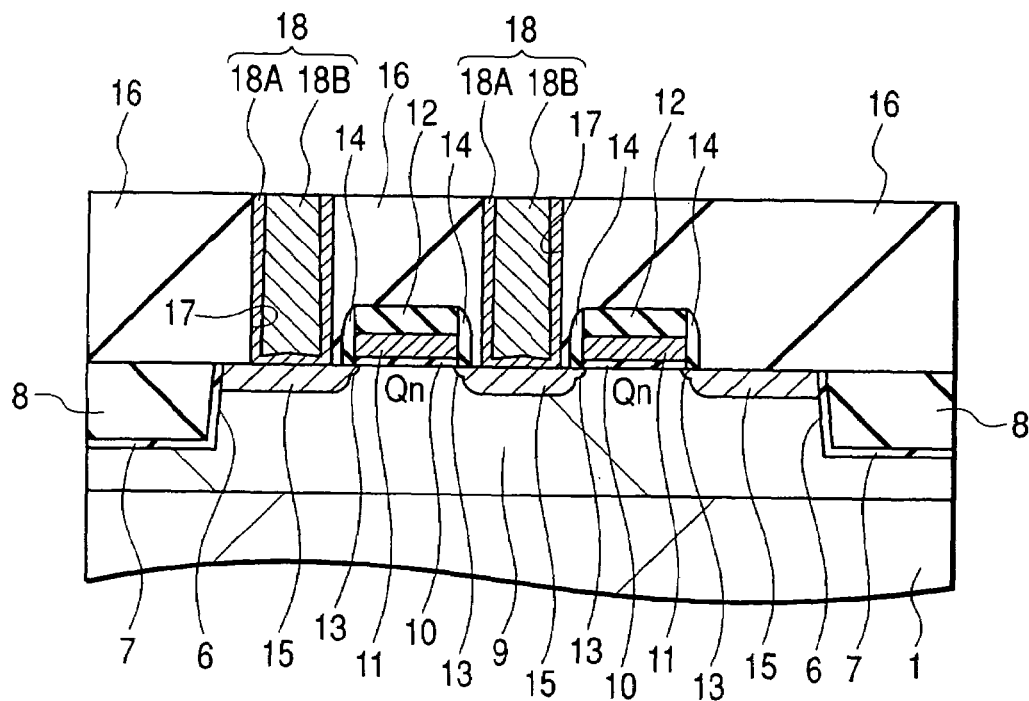
FIG. 25 is a fragmentary cross sectional view showing a step in the fabrication of a semiconductor integrated circuit device succeeding the step shown in FIG. 24.

Then, as shown in FIG. 25, a silicon oxide film 16 is deposited above the wafer by a CVD method. Subsequently, the silicon oxide film 16 deposited on the edge of the wafer 1 may be removed by polishing the edge of the wafer using the polishing drums 4A to 4C (refer to FIG. 4 to FIG. 7). This can eliminate the worry that the silicon oxide film 16 may be defoliated on the edge of the wafer 1. That is, it is possible to prevent the possibility that the defoliated silicon oxide film 16 will form obstacles so as to lower the yield of the semiconductor integrated circuit device.

Successively, the surface of the silicon oxide film 16 is planarized by polishing, for example, by a CMP method. Further, connection holes 17 are apertured in the oxide silicon film 16 above the $n^+$-type semiconductor region 15 of the main surface of the wafer 1 using photolithography. The step of removing the silicon oxide film 16 on the edge of the wafer 1 may be conducted after the step of planarizing the surface of the silicon oxide film 16 or after the step of aperturing the connection holes 17.

Then, a barrier conductor film 18A made, for example, of titanium nitride is formed over the wafer 1 by a sputtering method, and, further, a conductive film 18B, made, for example, of tungsten, is deposited by a CVD method. Successively, the barrier conductor film 18A and the conductive film 18G on the silicon oxide film 6, other than the connection holes 17, are removed, for example, by a CMP method to form plugs 18.

Figure 26:
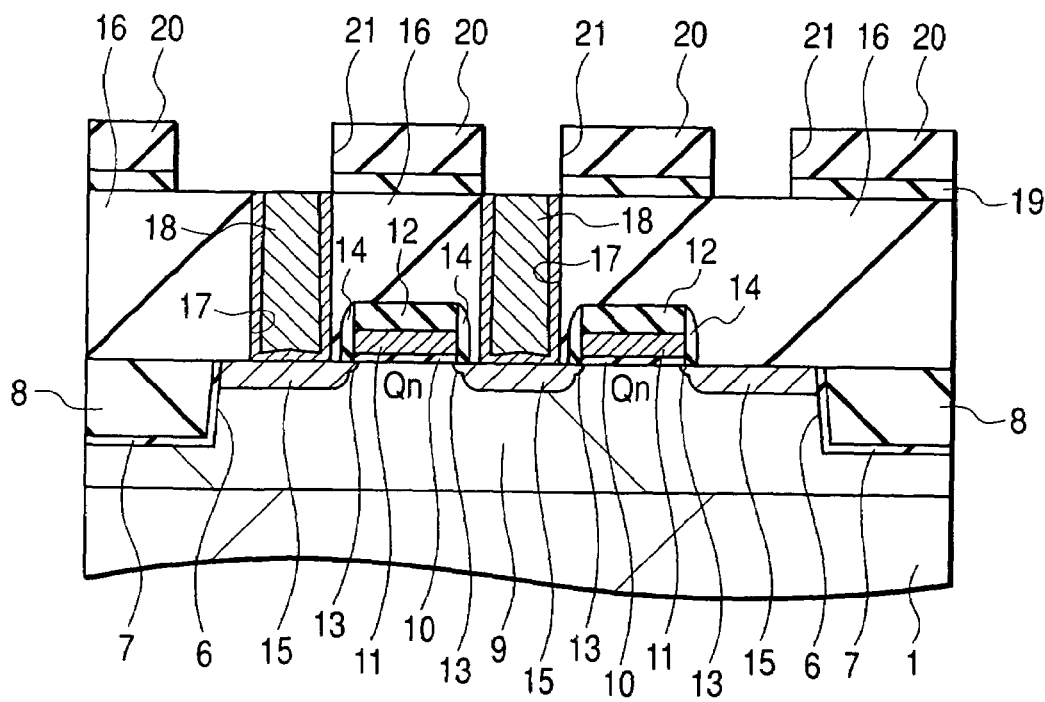
FIG. 26 is a fragmentary cross sectional view showing a step in the fabrication of a semiconductor integrated circuit device succeeding the step shown in FIG. 25.

Then, as shown in FIG. 26, a silicon nitride film is deposited above the wafer 1, for example, by a plasma CVD method to form an etching stopper film 19 (third insulative film) of about 100 nm thickness. The etching stopper film 19 is formed for the purpose of avoiding, upon forming grooves or holes for forming wirings in the insulative film thereabove, damage to the lower layers by excessive digging or deterioration the fabrication dimensional accuracy.

Figure 27:
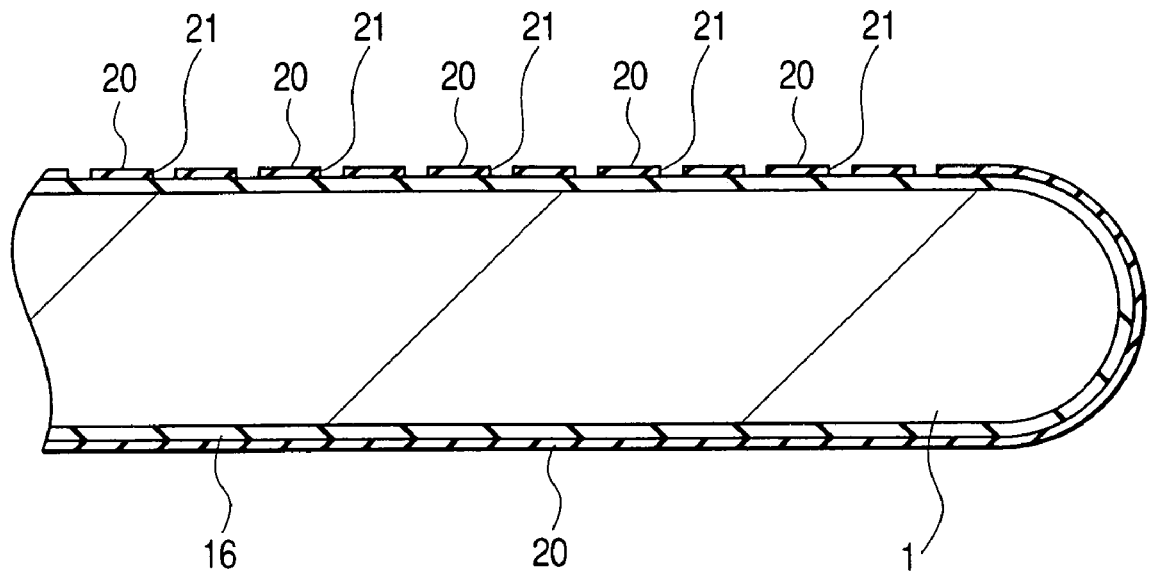
FIG. 27 is a fragmentary cross sectional view showing a step in the fabrication of a semiconductor integrated circuit as a preferred embodiment according to this invention.

Successively, a fluorine-added SiOF (silicon oxide) film is deposited on the surface of the etching stopper 19 by a CVD method so as to deposit an insulative film 20 (third insulative film) of about 400 nm thickness. In a case of using the SiOF film for the insulative film 20, since the SiOF film is a low dielectric film, the overall dielectric constant of the wirings for the semiconductor integrated circuit device can be lowered to reduce the wiring delay. FIG. 27 shows the vicinity of the edge of the wafer 1 in this step. In FIG. 27, for easy understanding of the subsequent step of depositing the insulation film and the step of forming the wiring groove, other components than the wafer 1, the silicon oxide film 16, the insulative film 20 and the wiring grooves 21 are not illustrated.

Then, in the same manner as used for the silicon oxide film 16, the edge of the wafer 1 may be polished by using the polishing drums 4A to 4C (refer to FIG. 4 to FIG. 7), thereby removing etching stopper 19 and the insulative film 20 deposited on the edge of the wafer 1. This can eliminate the possibility that the etching stopper 19 and the insulative film 20 will be defoliated on the edge of the wafer 1. That is, it is possible to prevent the possibility that the defoliated etching stopper film 19 and the insulative film 20 form obstacles that tend to lower the yield of the semiconductor integrated circuit device.

Successively, as shown in FIG. 26 described above, the surface of the insulative film 20 is planarized, for example, by polishing using a CMP method. Subsequently, the etching stopper film 19 and the insulative film 20 are fabricated by using photolithography and dry etching to form wiring grooves 21. The step of removing the etching stopper 19 and the insulative film 20 deposited on the edge of the wafer 1 may be conducted subsequent to the step of planarizing the surface of the insulative film 20 or subsequent to the step of forming the wiring grooves 21.

Successively, for removing the reaction layer on the surface of the plug 18 exposed at the bottom of the wiring grooves 21, the surface of the wafer 1 is treated in an Ar (argon) atmosphere. The amount of sputter etching in this step is, for example, of about 20 Å to 180 Å, preferably, about 100 Å being converted as a p-TEOS (Plasma Tetre-Ethyl-Ortho-Silicate) film. Embodiment 1 shows a case of removing the reaction layer on the surface of the plug 18 by sputter etching in an argon atmosphere as an example, but so long as the reaction layer can be removed sufficiently by annealing treatment, for example, in a reducing gas, such as $H_2$ (hydrogen) or CO (carbon monoxide) or a mixed atmosphere of a reducing gas and an inert gas, the sputter etching may be replaced with an annealing treatment. In the case of the annealing treatment, loss of the insulative film 28 upon sputter etching or charging damage to the gate oxide film 10 by electrons can be prevented.

Figure 28:
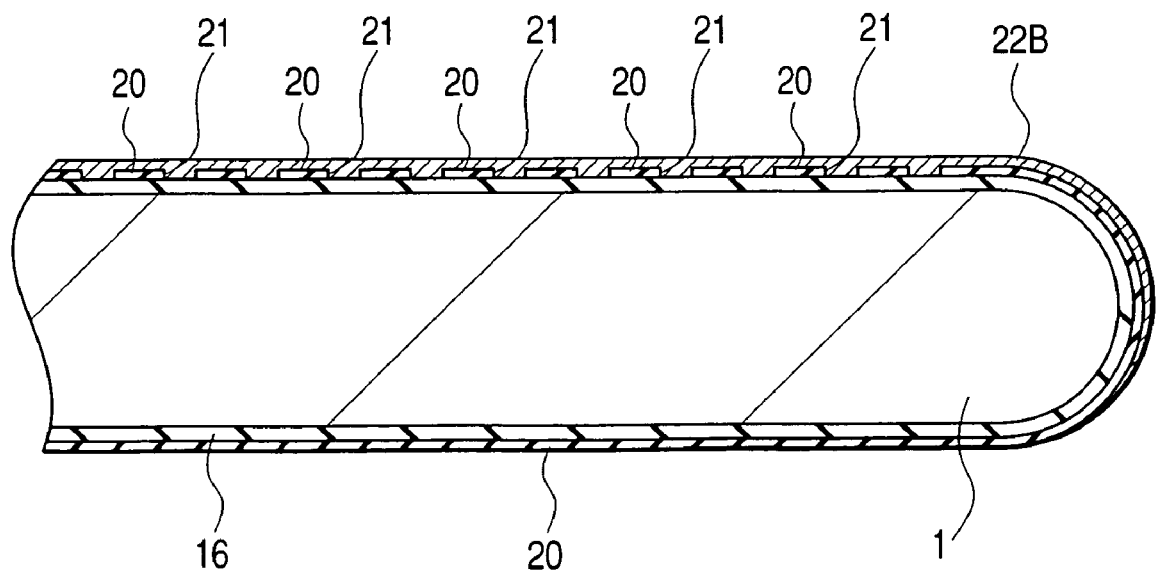
FIG. 28 is a fragmentary cross sectional view showing a step in the fabrication of a semiconductor integrated circuit device succeeding the step shown in FIG. 27.
Figure 29:
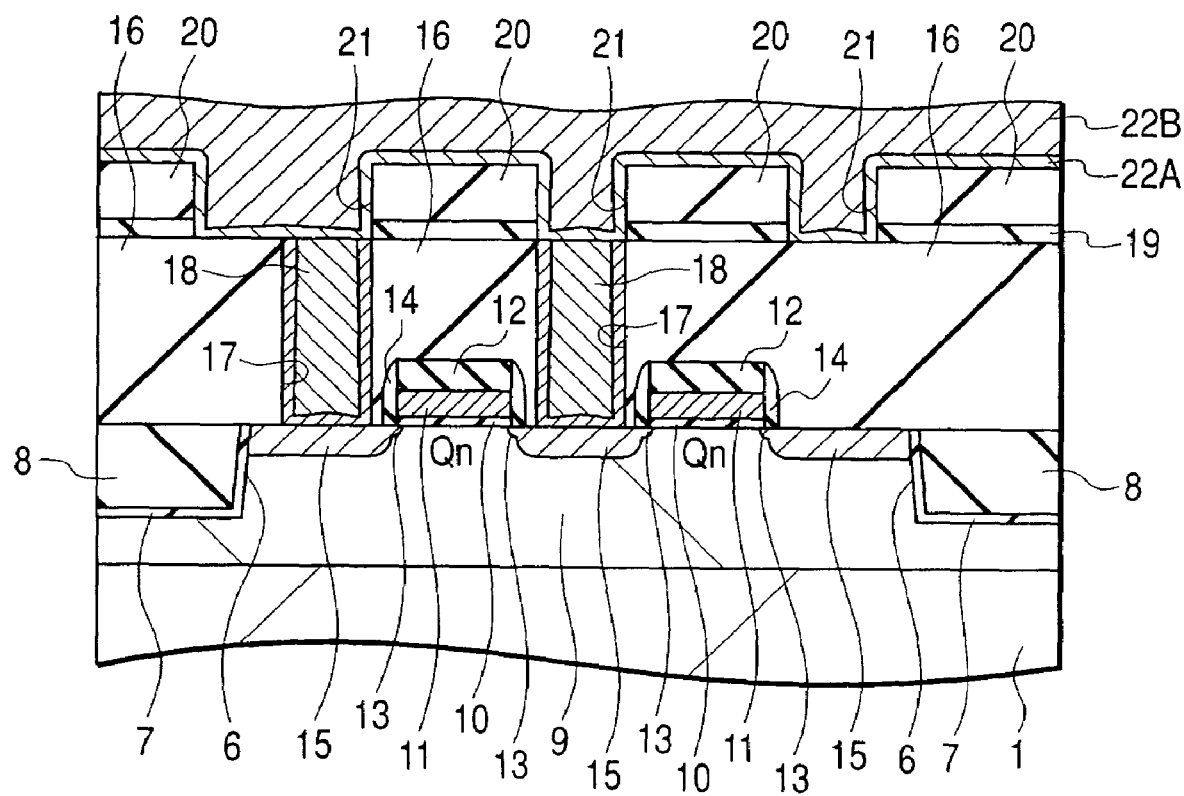
FIG. 29 is a fragmentary cross sectional view showing a step in the fabrication of a semiconductor integrated circuit device succeeding the step shown in FIG. 26.

Then, as shown in FIG. 28 and FIG. 29, a TaN (tantalum nitride) film, for example, as a barrier conductor film 22A (first conductive film) is deposited above the wafer 1 by conducting reactive sputtering to a tantalum target in an argon/nitrogen mixed atmosphere. In FIG. 28, the barrier conductor film 22A is not illustrated for easy understanding of the step that forms the buried wirings in the wiring grooves 21. The TaN film is deposited for the purpose of improving the adhesion of a Cu (copper) film to be deposited in the subsequent step and preventing diffusion of Cu, and the thickness of the film is about 30 nm. Further, in this Embodiment 1, while the TaN film is shown as an example of the barrier conductor film 22A, it may be a metal film, such as a film made of Ta (tantalum), a TiN (titanium nitride) film or a laminate film of a metal film and a nitride film. The barrier conductor film made of Ta or TaN has a much preferred adhesion with the Cu film, compared to the case of using TiN. Further, when the barrier conductor film 22A is made of a TiN film, the surface of the TiN film can be sputter etched just before forming the Cu film as the subsequent step. By the sputter etching, water, molecules of oxygen, etc. adsorbed on the surface of the TiN film can be removed so as to improve the adhesion of the Cu film. This technique has a particularly large effect in a case of breaking vacuum to expose the surface of the TiN film to atmospheric air after deposition thereby forming a copper film. This technique is not restricted to the TiN film, but it is also effective in the case of a TaN film, although the difference is present in view of the effect.

Successively, a seed film, for example, made of a Cu film or a copper alloy film is deposited by a long distance sputtering method (not illustrated). In a case where the seed film is made of a copper alloy film, Cu is incorporated by about 80% by weight or more in the alloy. The thickness of the Cu film is about 1000 Å to 2000 Å, preferably, about 1500 Å, at the surface of the barrier conductor film 22A, except for the inside of the wiring groove 21. While this embodiment represents an example of use of a long distance sputtering method for the deposition of the seed film, an ionizing sputtering for improving the directionality of the sputtering by ionizing sputter Cu atoms may also be used.

Successively, a Cu film, for example, is formed so as to bury the wiring grooves 21 over the entire surface of the wafer 1 deposited with the seed film, and the Cu film and the seed film are joined to constitute a conductive film 22B (first conductive film). The Cu film for burying the wiring grooves 21 is formed, for example, by an electrolytic plating method in which $H_2SO_4$ (sulfuric acid) with the addition of 10% $CuSO_4$ (copper sulfate) and an additive for improving the Cu film coverage is used, for example, as a plating solution. When the electrolytic plating method is used for the formation of the Cu film, since the growing rate of the Cu film can be controlled electrically, coverage of the conductive film 22B at the inside of the wiring grooves 21 can be improved. This embodiment shows a case of using the electrolytic plating method for the deposition of the conductive film 22B as an example, but an electroless plating method may also be used. Since application of a voltage is not required in a case of using the electroless plating method, damage attributable to the application of a voltage can be decreased compared with the case of using the electrolytic plating method.

Further, by fluidizing the Cu film by annealing treatment succeeding the step of forming the conductive film 22B, the property of the conductive film 22B burying the wiring grooves 21 can also be improved further.

Figure 30:
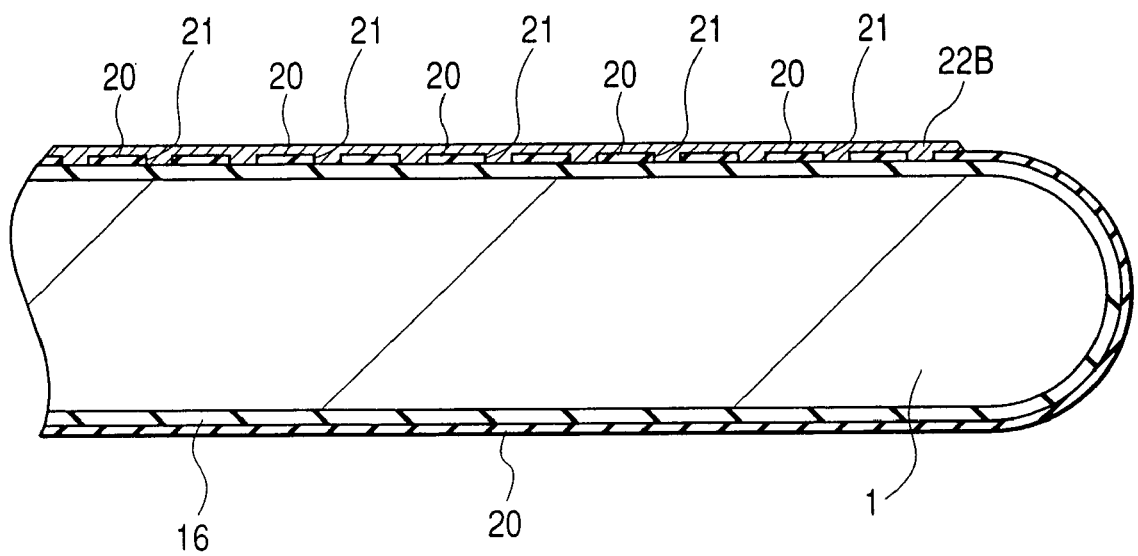
FIG. 30 is a fragmentary cross sectional view showing a step in the fabrication of a semiconductor integrated circuit device succeeding the step shown in FIG. 28.

Then, as shown in FIG. 30, the barrier conductor film 22A and the conductive film 22B on the edge of the wafer 1 are removed. The removing step can be conducted by using the polishing drums 4A to 4C (refer to FIG. 4 to FIG. 7) in the same manner as in the step of removing the silicon oxide film 2 and the silicon nitride film 3 on the edge of the wafer 1 described previously. This can prevent the barrier conductor film 22A and the conductive film 22B from remaining on the edge of the wafer 1. That is, it is possible to prevent the lowering of the yield of the semiconductor integrated circuit device of Embodiment 1 by preventing defoliation of the barrier conductor film 22A and the conductive film 22B which remains after polishing on the edge of the wafer 1, which tend to be deposited again on the wafer 1. Further, when Cu is diffused into the wafer 1, it lowers the gate withstand voltage of the nMISQn. However, by removing the conductive film 22B on the edge of the wafer 1, as described above, it is possible to prevent excessive Cu (conductive film 22B) deposited on the edge of the wafer 1 from diffusing into the wafer 1.

It has been described that the seed film is formed by the sputtering method. When the sputtering method is used, Cu atoms are implanted also into the underlying insulation film 20. Therefore, in the step of removing the barrier conductor film 22a and the conductive film 22B, it is also preferred to remove the underlying insulative film 20 by about 50 nm. This can prevent diffusion of excess Cu (conductive film 22B) deposited on the edge of the wafer 1 from diffusing into the wafer 1 more reliably. Further, while Embodiment 1 shows a case of forming the conductive film 22B by the plating method as an example, it may be formed by using a sputtering method. Since the Cu atoms are implanted further into the insulative film 20 when the sputtering method is used, the step of removing the insulative film 20 below the conductive film 22B on the edge of the wafer 1 constitutes a further effective means.

Figure 31:
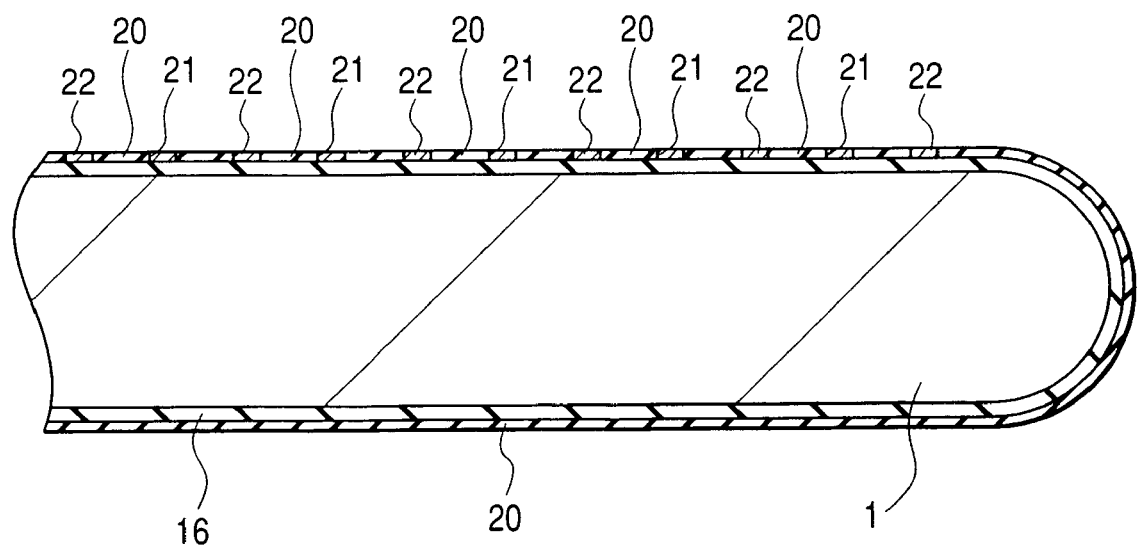
FIG. 31 is a fragmentary cross sectional view showing a step in the fabrication of a semiconductor integrated circuit device succeeding the step shown in FIG. 30.
Figure 32:
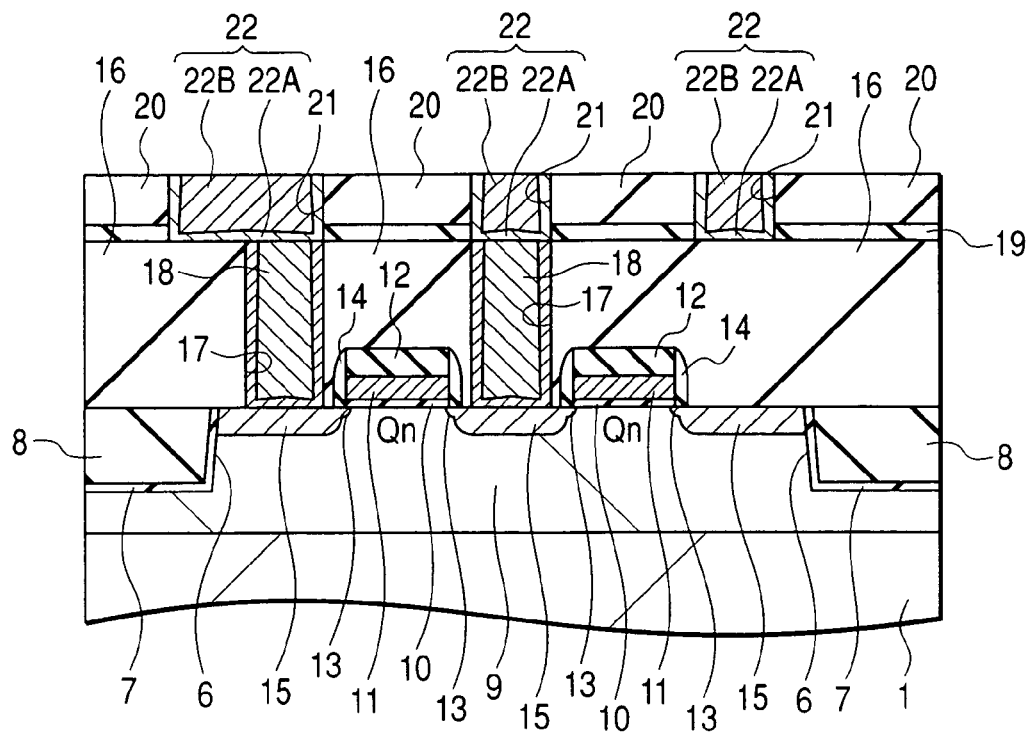
FIG. 32 is a fragmentary cross sectional view showing a step in the fabrication of a semiconductor integrated circuit as a preferred embodiment according to this invention.

Then, as shown in FIG. 31 and FIG. 32, the excessive barrier conductor film 22A and the conductive film 22B on the insulation film 20 are polished, for example, by a CMP method with the surface of the insulative film 20 in the chip region (refer to FIG. 14) serving as a polishing end point, thereby leaving the barrier conductor film 22A and the conductive film 22B in the wiring grooves 21 to form the wirings 22 (first wirings).

Figure 33:
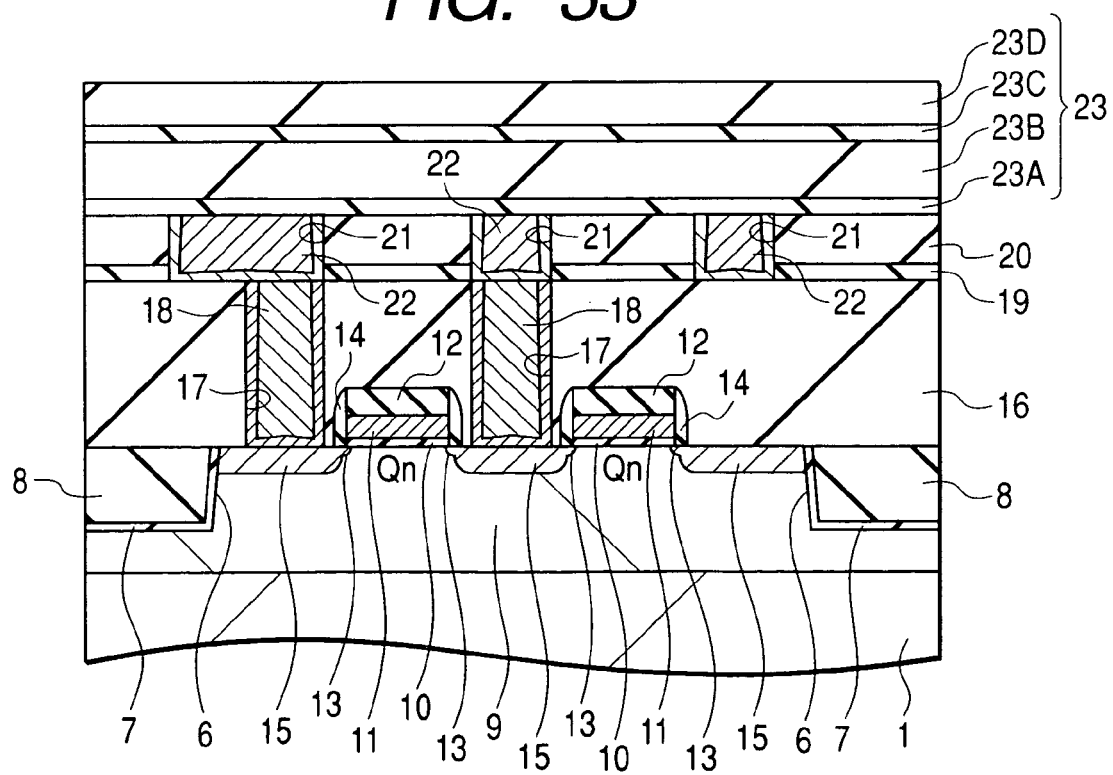
FIG. 33 is a fragmentary cross sectional view showing a step in the fabrication of a semiconductor integrated circuit device succeeding the step shown in FIG. 32.

Successively, after removing polishing abrasive grains and Cu deposited over the surface of the wafer 1 by a two step brush scrubbing cleaning, for example, using 0.1% aqueous ammonia solution and purified water, a silicon nitride film is deposited on the buried wirings 22 and the insulative film 20 to form a barrier insulative film 23A, as shown in FIG. 33. For the deposition of the silicon nitride film, a plasma CVD method can be used, for example, and the film thickness is about 50 nm. The barrier insulative film 23A has a function of suppressing the diffusion of Cu as the conductive film 22B. This can prevent diffusion of copper into the barrier insulative film 22A, and the silicon oxide film 16, and the insulative film 20 and the insulative film formed on the barrier insulative film 23A, in the subsequent step and maintain the insulation property thereof, so as to enhance the reliability of the semiconductor integrated circuit device. Further, the barrier insulative film 23A also functions as a etching stopper layer upon conducting etching in the subsequent step.

Then, an insulative film 23B of about 400 nm thickness is deposited on the surface of the barrier insulative film 23A. The insulative film 23B is, for example, an SiOF film, such as a CVD oxide film, for example, with addition of fluorine. In a case of using the SiOF film as the insulative film 23B, the overall dielectric constant of the wirings in the semiconductor integrated circuit device can be lowered to improve the wiring delay.

Then, a silicon nitride film is deposited on the surface of the insulation film 23B, for example, by a plasma CVD method so as to deposit an etching stopper film 23C of about 50 nm thickness. When grooves or holes for forming wirings are formed on the insulative film deposited on the etching stopper film 23C in the subsequent step, the etching stopper film 23 is used for avoiding excessive digging damage of the lower layer or deterioration the fabrication dimensional accuracy.

Successively, an SiOF film, for example, is deposited on the surface of the etching stopper film 23C so as to form an insulation film 23D, and the barrier insulation film 23A, the insulation film 23B, the etching stopper film 23C and the insulative film 23D are joined to constitute an insulative film 23 (fourth insulative film). The insulative film 23D is deposited by a CVD method, and the thickness is, for example, about 300 nm. The insulative film 23D has a function of lowering the overall dielectric constant of the wirings in the semiconductor integrated circuit device like that of the insulative film 23B and can reduce the wiring delay.

Figure 34:
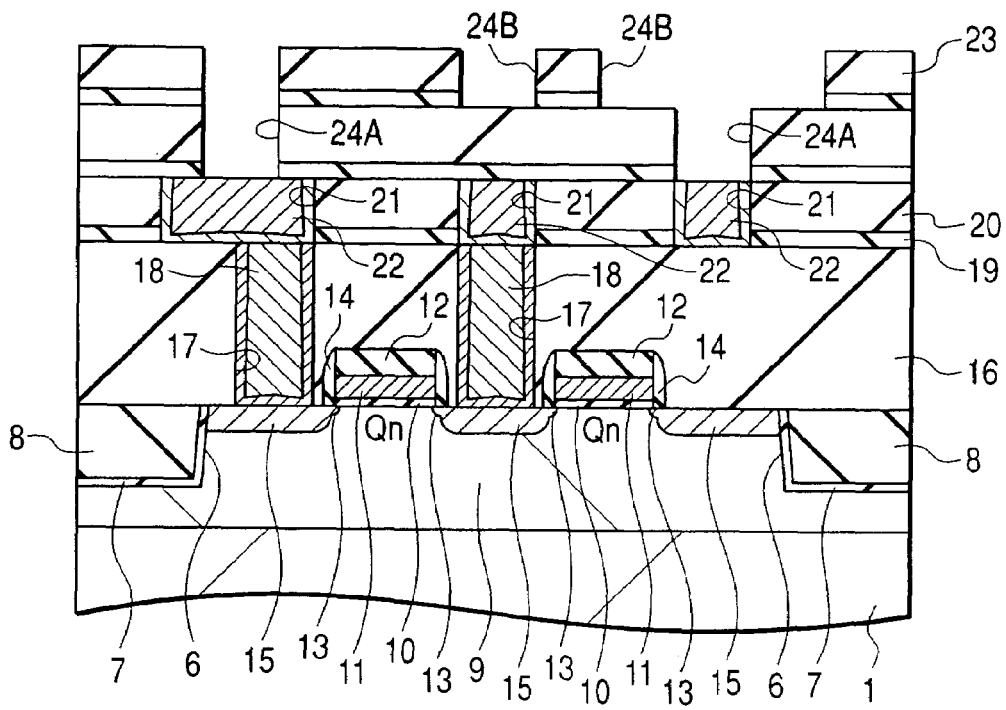
FIG. 34 is a fragmentary cross sectional view showing a step in the fabrication of a semiconductor integrated circuit device succeeding the step shown in FIG. 33.

Subsequently, the insulative film 23 deposited on the edge of the wafer 1 may be removed by polishing the edge of the wafer 1 by using the polishing drum 4A to 4C (refer to FIG. 4 to FIG. 7). This can eliminate the worry that the insulative film 23 will be defoliated on the edge of the wafer 1. That is, the possibility that the defoliated insulative film 23 will form obstacles that lower the yield of the semiconductor integrated circuit device can be prevented Then, after planarizing the insulative film 23D, for example, by polishing the surface using a CMP method, connection holes 24A for connecting the buried wirings 22 serving as the lower layer wirings to upper layer wirings to be formed in the subsequent step are formed as shown in FIG. 34. For the connection holes 24A, a connection pattern is formed by forming a photoresist film having a shape identical with that of the connection hole pattern for connection with the buried wirings 22 on the insulative film 23D and conducting dry etching using the same as a mask. Successively, the photoresist film is removed, a photoresist film having a shape identical with that of the wiring groove pattern is formed by a photolithographic step on the insulative film 23D, and the wiring grooves 24B are formed by dry etching using the photoresist film as a mask. The step of removing the insulative film 23 deposited on the edge of the wafer 1 may be conducted after the step of planarizing the surface of the insulative film 23D or after the step of forming the connection holes 24A and the wiring grooves 24B.

Successively, sputter etching for removing the reaction layer on the surface of the buried wirings 22 exposed at the bottom of the connection holes 24A is conducted by the same step as the sputter etching step conducted for removing the reaction layer on the surface of the plugs 18 that are exposed at the bottom of the wiring grooves 21. The amount of the sputter etching is about 20 Å to 180 Å and, preferably, about 100 Å being converted as the P-TEOS film.

Figure 35:
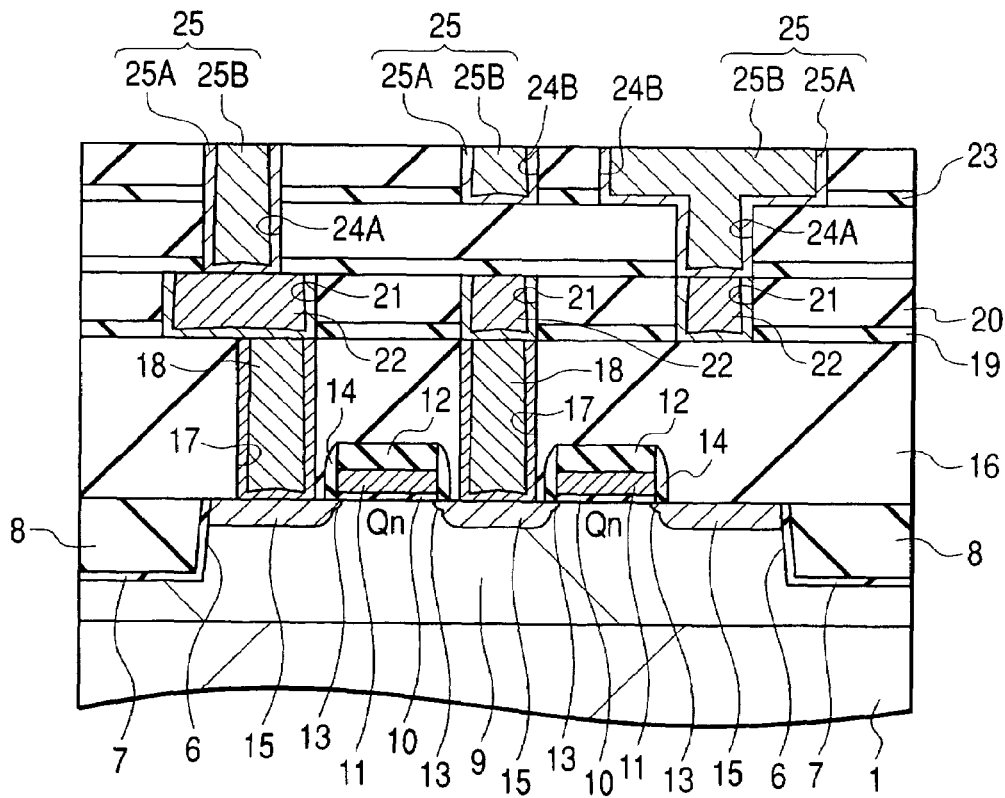
FIG. 35 is a fragmentary cross sectional view showing a step in the fabrication of a semiconductor integrated circuit device succeeding the step shown in FIG. 34.

Then, as shown in FIG. 35, a TaN film serving as the barrier conductor film 25A is deposited over the wafer 1 by the same step as the step of depositing the TaN film serving as the barrier conductor film 22A (refer to FIG. 29). While Embodiment 1 describes the TaN film as an example of the barrier conductor film 25A, it may be a metal film, such as a film made of Ta, a TiN film or a stacked film of a metal film and nitride film like that in the barrier conductor film 22A.

Successively, a Cu film or a copper alloy film serving as the seed film, like that of the seed film used upon forming the conductive film 22B, is deposited, for example, by a long distance sputtering method or an ionized sputtering method (not illustrated). Then, a Cu film, for example, is deposited so as to bury the connection holes 24A and the wiring grooves 24B using a step similar to the step of depositing the Cu film serving as the conductive film 22B that buries the wiring grooves 21 over the entire surface of the wafer 1 deposited with the seed film, and the Cu film and the seed film are joined to constitute a conductive film 25B. After forming the conductive film 25B, the Cu film is fluidized by annealing treatment to further improve the burying property of the conductive film 25B into the connection holes 24A and the wiring grooves 24B.

Then, the barrier conductor film 25A and the conductive film 25B on the edge of the wafer 1 are removed by a step similar to the step used for removing the barrier conductor film 22A and the conductive film 22B on the edge of the wafer 1 (refer to FIG. 30). This can prevent a lowering of the yield of the semiconductor integrated circuit device of Embodiment 1 by preventing defoliation of the barrier conductor film 25A and the conductive film 25B remaining after polishing on the edge of the wafer 1 after the CMP step to be described later, which are likely to be deposited again on the wafer 1. Further, when Cu is diffused into the wafer 1, it lowers the gate withstand voltage of the nMISQn. However, when the conductive film 25B on the edge of the wafer 1 is removed, excess Cu (conductive film 25B) deposited on the edge of the wafer 1 can be prevented from diffusing into the wafer 1.

Further, since the Cu atoms have been implanted also into the underlying insulative film 23D upon deposition of the seed film, it is preferred to remove also the underlying insulation film by about 50 nm. This can even more reliably prevent excessive Cu (conductive film 25B) deposited on the edge of the wafer 1 from diffusing into the wafer 1. Further, Embodiment 1 describes a case of forming the conductive film 25B by the plating method as an example, but it may be formed by using a sputtering method. When the sputtering method is used, since Cu atoms are further implanted into the insulation film 23D, the step of removing the insulative film 23D below the conductive film 25B on the edge of the wafer 1 can constitute a further effective means.

Then, the excessive barrier conductive film 25A and the conductive film 25B on the insulative film 23D are removed, leaving the barrier conductor film 25A and the conductive film 25B in the inside of the connection holes 24A and the wiring grooves 24B to form the buried wirings 25. The barrier conductor film 25A and the conductive film 25 are removed, for example, by polishing using a CMP method.

Successively, the polishing abrasive grains and Cu deposited over the surface of the wafer 1 are removed by a two step brush scrubbing cleaning using, for example, 0.1% aqueous ammonia solution and purified water to fabricate a semiconductor integrated circuit device according to this embodiment. Wirings may also be formed in a more layered structure above the buried wirings 26 by steps similar to those explained with reference FIG. 33 to FIG. 35.

Embodiment 2

In Embodiment 2, thin films to be removed on the edge of the wafer are patterned before the removing step. Other components and fabrication steps are identical to those of Embodiment 1 as described above.

The method of fabrication of the semiconductor integrated circuit device of Embodiment 2 includes the same steps up to those that have been explained for Embodiment 1 with reference to FIG. 1 and FIG. 2.

Figure 36:
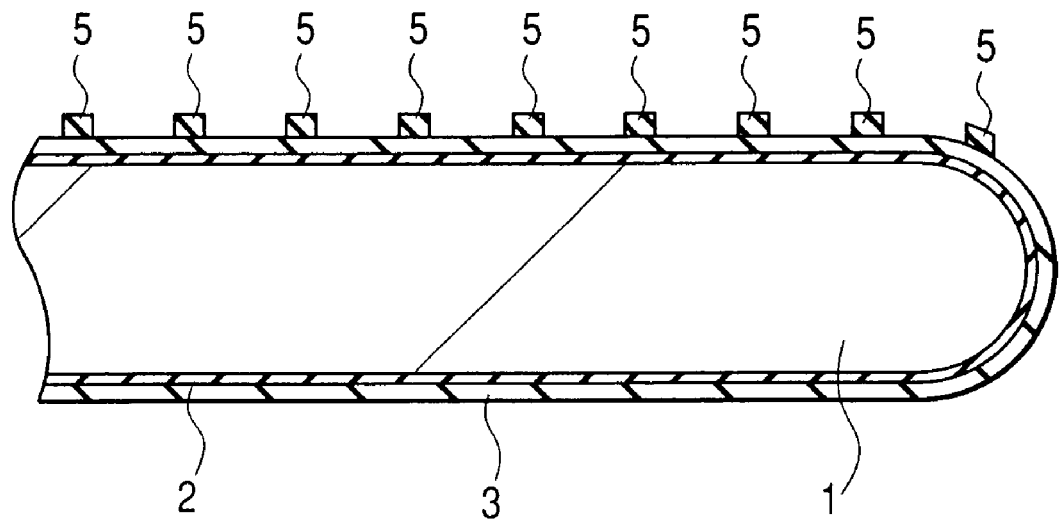
FIG. 36 is a fragmentary cross sectional view showing an example of a method of fabrication of a semiconductor integrated circuit device representing another embodiment according to this invention.
Figure 37:
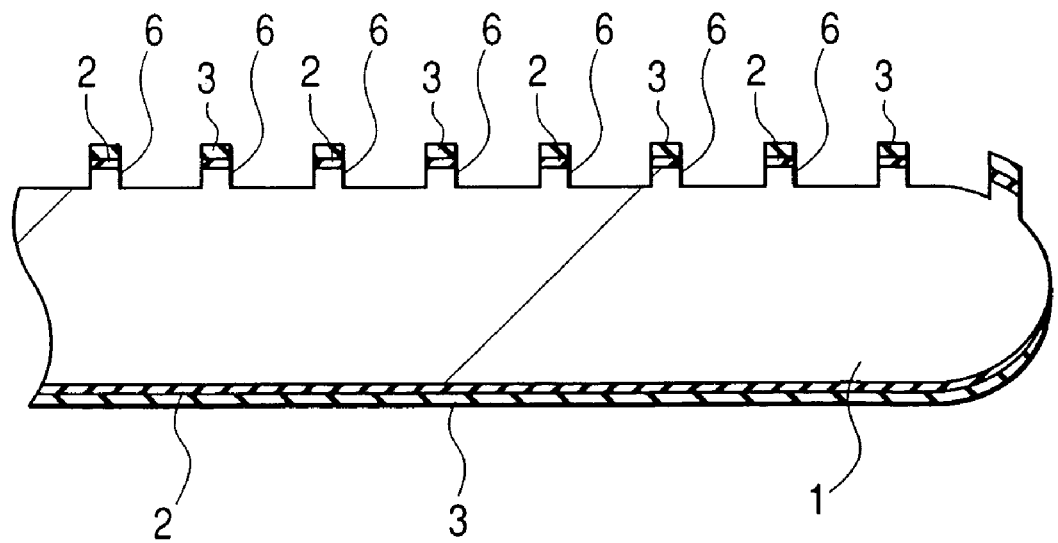
FIG. 37 is a fragmentary cross sectional view showing a step in the fabrication of a semiconductor integrated circuit device succeeding the step shown in FIG. 36.

Then, as shown in FIG. 36, after coating the photoresist film 5 above the wafer 1, the photoresist film 5 is patterned by exposure using a mask. Successively, as shown in FIG. 37, the silicon nitride film 3 and the silicon oxide film 2 in the device isolation regions are removed by dry etching using the photoresist film 5 as a mask. Successively, grooves 6, each of about 350 nm depth, are formed above the wafer 1 in the device isolation region by dry etching using the silicon nitride films 3 as a mask.

Figure 38:
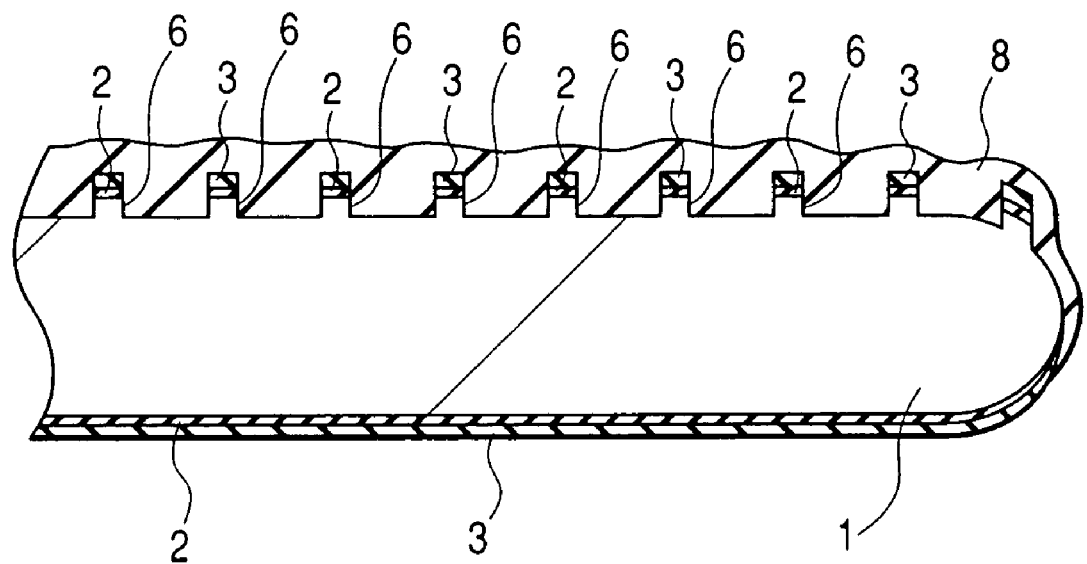
FIG. 38 is a fragmentary cross sectional view showing a step in the fabrication of a semiconductor integrated circuit device succeeding the step shown in FIG. 37.

Then, as shown in FIG. 38, the wafer 1 is heat treated at about 1000© to form the thin silicon oxide film 7 of about 10 nm thickness to the inner wall of the grooves 6 for removing the damage layer formed on the inner wall of the grooves 6 by etching. Successively, the silicon oxide film 8 of about 380 nm thickness is deposited above the wafer 1 by a CVD method and then the wafer 1 is heat treated to densify (sinter) the silicon oxide film 8 in order to improve the film quality of the silicon oxide film 8.

Figure 39:
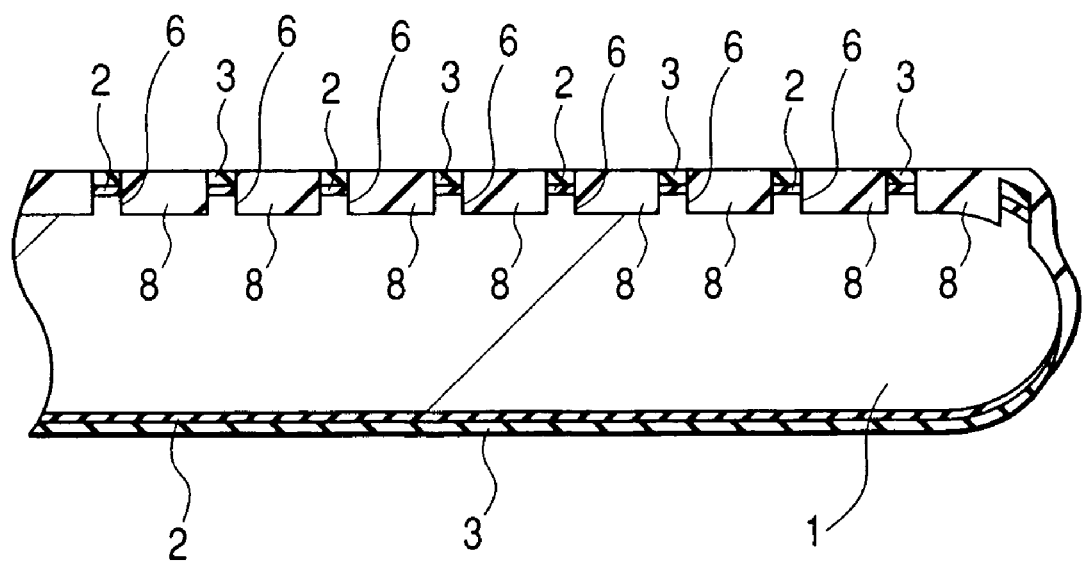
FIG. 39 is a fragmentary cross sectional view showing a step in the fabrication of a semiconductor integrated circuit device succeeding the step shown in FIG. 38.
Figure 40:
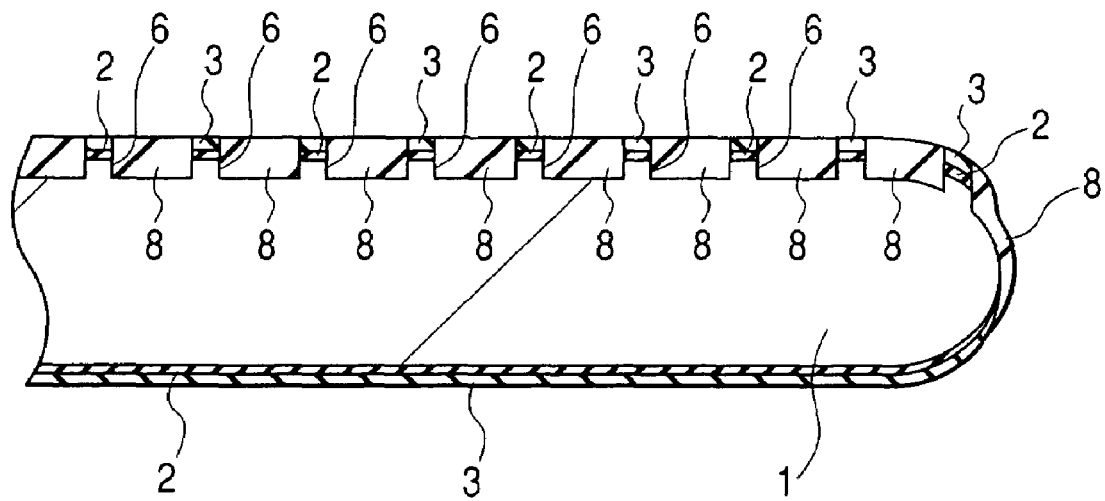
FIG. 40 is a fragmentary cross sectional view showing a step in the fabrication of a semiconductor integrated circuit device succeeding the step shown in FIG. 39.

Then, as shown in FIG. 39, the silicon oxide film 8 is polished by a CMP method using the silicon nitride film 3 as a stopper, leaving the film at the inside of the grooves 6, to thereby form a device isolation groove planarized at the surface. Successively, as shown in FIG. 40, the silicon oxide film 8 on the edge of the wafer 1 is removed until the silicon nitride film 3 therebelow is exposed by using the polishing drums 4A to 4C, as explained with reference to FIG. 4 to FIG. 7, with reference to Embodiment 1 described previously.

Figure 41:
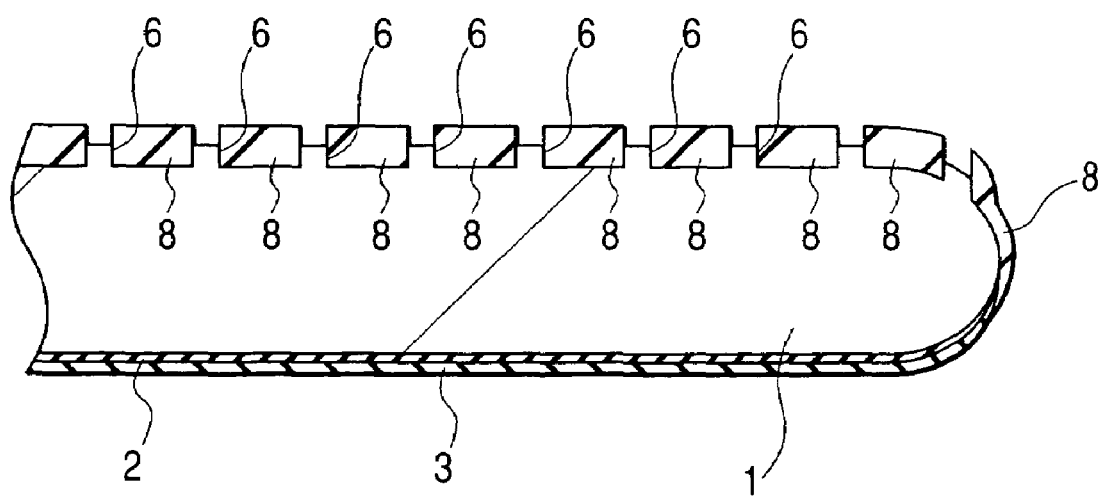
FIG. 41 is a fragmentary cross sectional view showing a step in the fabrication of a semiconductor integrated circuit device succeeding the step shown in FIG. 40.

Successively, as shown in FIG. 41, the silicon nitride film 3 and the silicon oxide film 2 remaining above the wafer 1 are removed by wet etching using hot phosphoric acid, as shown in FIG. 41. In this case, since the surface of the silicon oxide film 3 is exposed on the edge of the wafer 1, the silicon nitride film 3 and the silicon oxide film 2 can be removed over the entire surface of the wafer 1. This can prevent the possibility that the silicon nitride film 3 and the silicon oxide film 2 are defoliated so as to form obstacles in the subsequent cleaning step.

Figure 42:
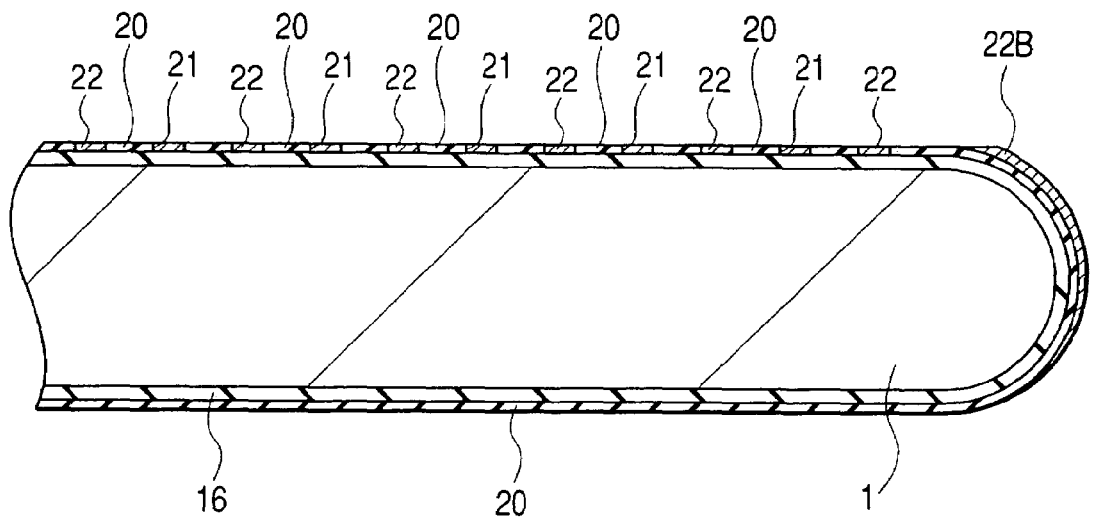
FIG. 42 is a fragmentary cross sectional view showing an example of a method of fabrication of a semiconductor integrated circuit device representing a further embodiment according to this invention.

Then, after carrying out the identical steps to those explained with reference to FIG. 23 to FIG. 29 for Embodiment 1 as described previously, the excessive barrier conductor film 22A (refer to FIG. 29) and conductive film 22B (refer to FIG. 29) on the insulative film 20 are removed by polishing, for example, using a CMP method, leaving the barrier conductive film 22A and the conductive film 22B in the wiring grooves 21 to form buried wirings 22, as shown in FIG. 42.

Figure 43:
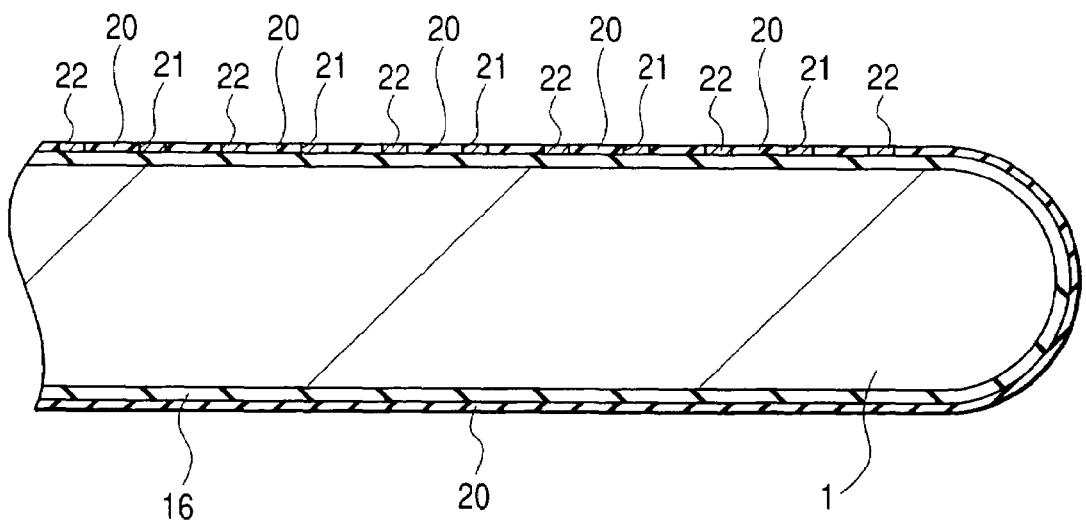
FIG. 43 is a fragmentary cross sectional view showing a step in the fabrication of a semiconductor integrated circuit device succeeding the step shown in FIG. 42.

As shown in FIG. 43, the barrier conductor film 22A and the conductive film 22B on the edge of the wafer 1 are removed by using the polishing drums 4A to 4C, as explained with reference to FIG. 4 to FIG. 7 for Embodiment 1 described previously. This can prevent the barrier conductive film 22A and the conductive film 22B from remaining on the wafer edge of the wafer 1. That is, it can prevent lowering of the yield of the semiconductor integrated circuit device of Embodiment 2 by defoliation of the barrier conductive film 22a and the conductive film 22B that remain after polishing on the edge of the wafer 1, which are likely to be deposited again on the wafer 1.

Subsequently, a semiconductor integrated circuit device of Embodiment 2 is fabricated by the steps identical to those explained with reference to FIG. 33 to FIG. 35 in Embodiment 1. Embodiment 1 describes a case of removing the insulative film 23 deposited on the edge of the wafer 1 (refer to FIG. 33) before planarizing the surface of the insulative film 23D (refer to FIG. 33) as an example, but the step of removing the insulative film 23B may be conducted after forming the connection holes 24A and the wiring grooves 24B or before depositing the barrier conductor film 25A (refer to FIG. 35). Further, Embodiment 1 describes a case of removing the insulative film 23 deposited on the edge of the wafer 1 (refer to FIG. 33) before the step of removing the excessive barrier conductor film 25A and conductive film 25B on the insulative film 23D (refer to FIG. 35) by the CMP method, but the step may be conducted after removing the barrier conductor film 25A and the conductive film 25B (refer to FIG. 35) by the CMP method.

Embodiment 3

In the method of fabrication of a semiconductor integrated circuit device according to Embodiment 3, this invention is applied to a semiconductor integrated circuit device having wirings, for example, formed of Al (aluminum) or aluminum alloy.

The method of fabrication of the semiconductor integrated circuit device of Embodiment 3 includes the same steps as those explained with reference to FIG. 1 to FIG. 25 for Embodiment 1.

Figure 44:
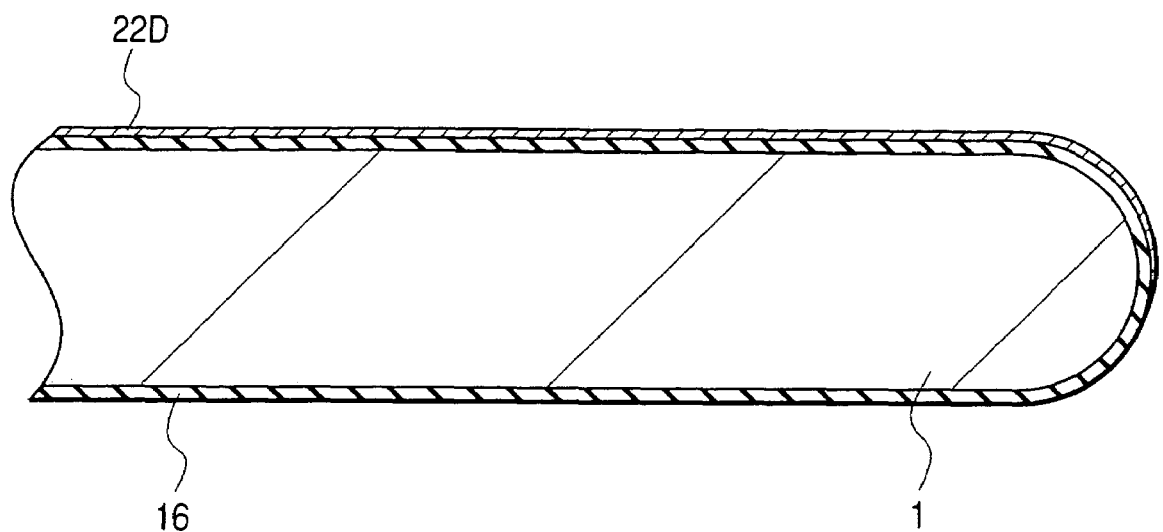
FIG. 44 is a fragmentary cross sectional view showing an example of a method of fabrication of a semiconductor integrated circuit device representing a still further embodiment according to this invention.
Figure 45:
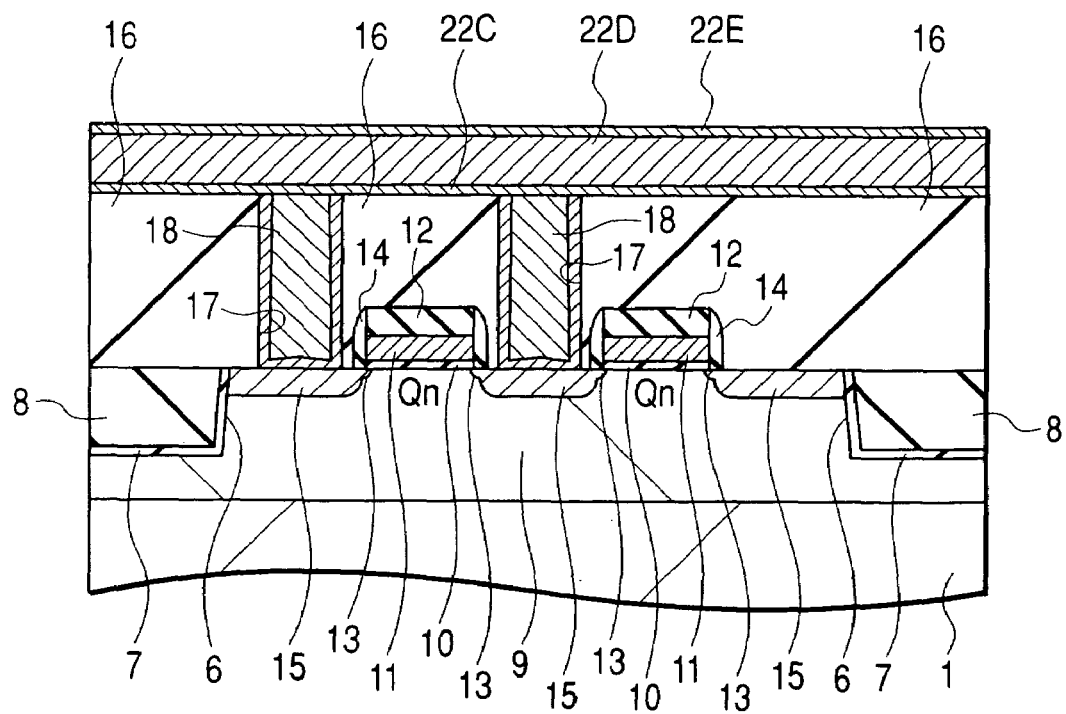
FIG. 45 is a fragmentary cross sectional view showing, on an enlarged scale, the vicinity of a device forming-surface of the wafer shown in FIG. 44.

Subsequently, as shown in FIG. 44 and FIG. 45, a conductive film 22C (first conductive film), such as TiN, is deposited above the wafer 1 by a sputtering method. In FIG. 44, the conductive film 22C is not illustrated to provide easy understanding of the step for forming wirings on the silicon oxide film 16.

Successively, a conductive film 22D, for example, made of Al (first conductive film) is deposited on the surface of the conductive film 22C. Further, successively, a conductive film 22E, for example, made of TiN is deposited on the surface of the conductive film 22D. The conductive film 22E has a function of preventing random reflection of light when the conductive film 22C, the conductive film 22D and the conductive film 22E (first conductive film) are patterned by a photolithographic step. Deposition of the conductive film 22D and the conductive film 22E are conducted, for example, by a sputtering method.

Figure 46:
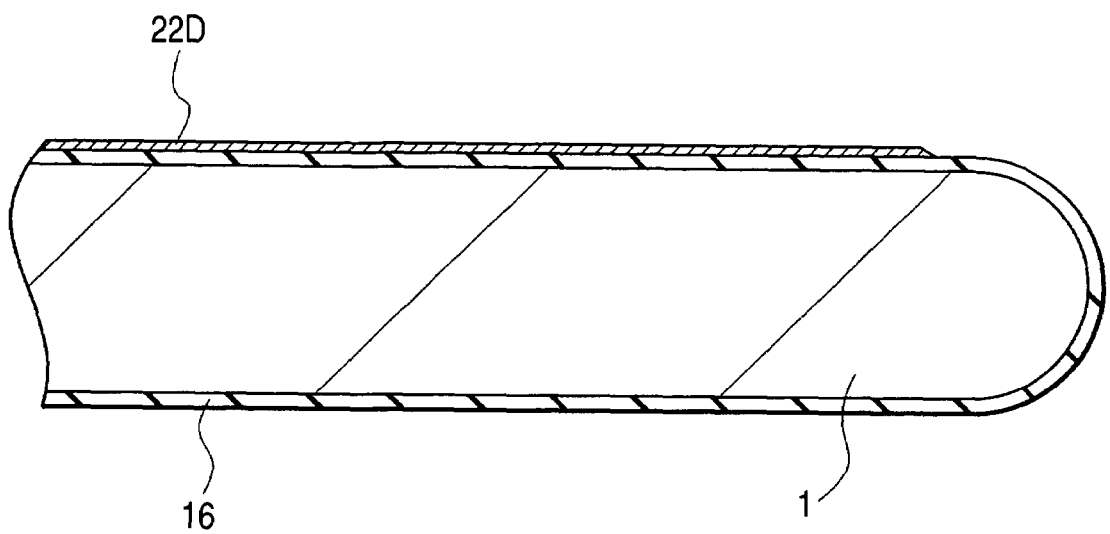
FIG. 46 is a fragmentary cross sectional view showing a step in the fabrication of a semiconductor integrated circuit device succeeding the step shown in FIG. 44.

Then, as shown in FIG. 46, the conductive films 22C to 22E on the edge of the wafer 1 are removed by using the polishing drum 4A to 4c that were explained with reference to FIG. 4 to FIG. 7 for Embodiment 1 as described previously. This can prevent a the conductive films 22C to 22E from remaining on the edge of the wafer 1. That is, it is possible to prevent lowering of the yield of the semiconductor integrated circuit device of Embodiment 3 due to defoliation of the conductive film 22C to 22E remaining after polishing on the edge of the wafer 1, which are likely to be deposited again on the wafer 1.

Figure 47:
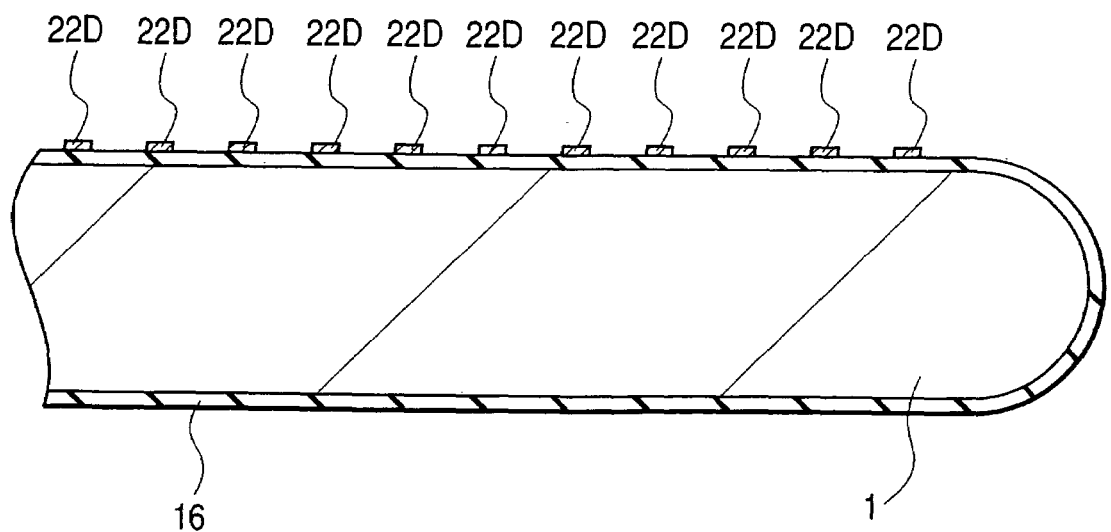
FIG. 47 is a fragmentary cross sectional view showing a step in the fabrication of a semiconductor integrated circuit device succeeding the step shown in FIG. 46.
Figure 48:
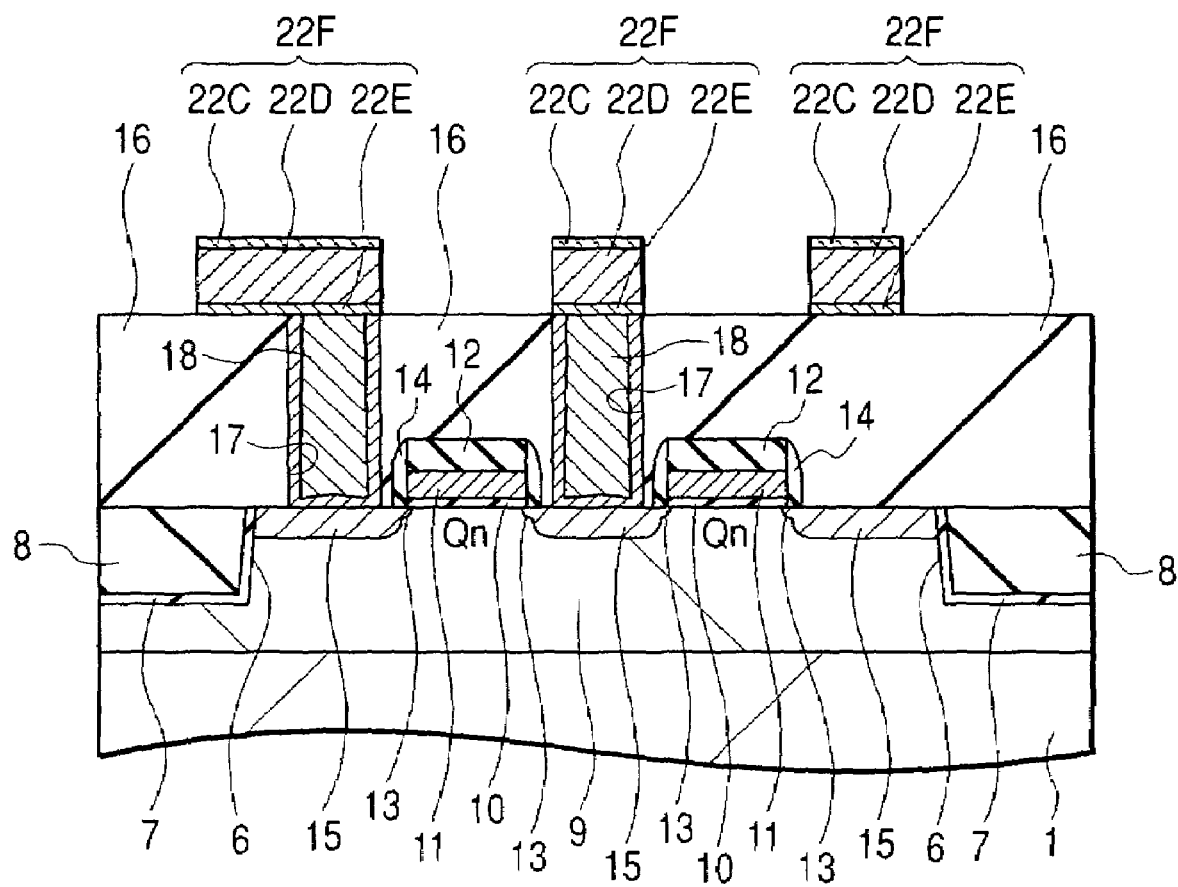
FIG. 48 is a fragmentary cross sectional view showing an example of a method of fabrication of a semiconductor integrated circuit device representing still another embodiment according to this invention.

Then, as shown in FIG. 47 and FIG. 48, the conductive films 22C to 22E are fabricated by using a dry etching technique to form wirings 22F to fabricate a semiconductor integrated circuit device according to Embodiment 3. Embodiment 3 is directed to a case of removing the conductive films 22C to 22E deposited on the edge of the wafer 1 before forming the wirings 22F as an example, but the step of removing the conductive films 22C to 22E may be conducted after forming the wirings 22F.

The invention developed by the present inventors has been explained concretely with reference to various embodiments thereof, but it will be apparent that the invention is not restricted to the embodiments described above, but may be variously modified within a scope not departing the gist thereof.

For example, the embodiments described above are directed to a case where three polishing drums are used for polishing the edge of the wafer, but more than three polishing drums may also be used.

Further, the embodiments described above are directed to a case of polishing the edge of the wafer by using polishing drums, but the wafer may be polished by using a grinding wheel profiled to the edge of the wafer, or a polishing tape manufactured by embedding a slurry into an organic resin.

Further, the embodiments described above are directed to an example of a method of fabrication of a semiconductor circuit device in which a nMIS is formed to the p-well, but it may be applicable also to a method of fabrication of a semiconductor integrated circuit device in which a pMIS is formed to an n-well.

Among the features of the invention disclosed in the present application, effects obtained by typical ones are briefly explained as below.

(1) Since thin films formed on the edge of the wafer are removed, it is possible to prevent a lowering of the yield of the semiconductor integrated circuit device caused by defoliation of the thin films, which tend to be deposited again on the wafer.

(2) Since the angle at which the wafer and the polishing drum are in contact with each other and the optimal polishing speed can be set in accordance with the shape of the edge of the wafer and the deposition state of the thin films as a target to be removed on the edge of the wafer, the thin films can be removed over the entire area on the edge of the wafer.

What is claimed is:

1. A fabrication method of a semiconductor integrated circuit device comprising the steps of:
   (a) forming a first conductive film on an insulating film on a semiconductor wafer, wherein said first conductive film is a lamination of a film of TiN, a conductive film comprised of aluminum as a main component and a TiN film;
   (b) removing the first conductive film on an edge of the semiconductor wafer with a polishing means using a slurry or an abrasive wheel; and
   (c) patterning the first conductive film by dry etching the first conductive film, thereby forming wiring patterns, including convex wiring patterns on the insulating film after the step (b).

2. A fabrication method of a semiconductor integrated circuit device according to claim 1, wherein said polishing means is comprised of three polishing wheels for polishing an upper surface, edge portion and rear surface of the semiconductor wafer.

3. A fabrication method of a semiconductor integrated circuit device comprising the steps of:
   (a) forming a first conductive film on an insulating film on a semiconductor wafer, wherein said first conductive film is a lamination of a film of TiN, a conductive film comprised of aluminum as a main component and a TiN film;
   (b) patterning the first conductive film on a product obtainable area and on a non-product obtainable area, thereby forming wirings by dry etching the first conductive film, including convex wiring patterns on the insulating film; and
   (c) removing the first conductive film on an edge of the semiconductor wafer with a polishing means using a slurry or an abrasive wheel after the step (b).

4. A fabrication method of a semiconductor integrated circuit device according to claim 3, wherein said polishing means is comprised of three polishing wheels for polishing an upper surface, edge portion and rear surface of the semiconductor wafer.

5. A fabrication method of a semiconductor integrated circuit device comprising the steps of:
   (a) forming a first conductive film on an insulating film on a semiconductor wafer;
   (b) removing the first conductive film on an edge of the semiconductor wafer with a polishing means using a slurry or an abrasive wheel, wherein said polishing means is comprised of three polishing wheels for polishing an upper surface, edge portion and rear surface of the semiconductor wafer; and
   (c) patterning the first conductive film by dry etching the first conductive film, thereby forming wiring patterns, including convex wiring patterns on the insulating film after the step (b).

6. A fabrication method of a semiconductor integrated circuit device comprising the steps of:
   (a) forming a first conductive film on an insulating film on a semiconductor wafer;
   (b) patterning the first conductive film on a product obtainable area and on a non-product obtainable area, thereby forming wirings by dry etching the first conductive film, including convex wiring patterns on the insulating film; and
   (c) removing the first conductive film on an edge of the semiconductor wafer with a polishing means using a slurry or an abrasive wheel after the step (b), wherein said polishing means is comprised of three polishing wheels for polishing an upper surface, edge portion and rear surface of the semiconductor wafer.

* * * * *